US011469213B2

(12) United States Patent
Seidemann et al.

(10) Patent No.: US 11,469,213 B2
(45) Date of Patent: Oct. 11, 2022

(54) SYSTEMS, METHODS, AND APPARATUSES FOR IMPLEMENTING REDUCED HEIGHT SEMICONDUCTOR PACKAGES FOR MOBILE ELECTRONICS

(71) Applicant: Intel Corporation, Santa Clara, CA (US)

(72) Inventors: Georg Seidemann, Landshut (DE);
Thomas Wagner, Regelsbach (DE);
Klaus Reingruber, Langquaid (DE);
Bernd Waidhas, Pettendorf (DE);
Andreas Wolter, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,970

(22) PCT Filed: Sep. 28, 2016

(86) PCT No.: PCT/US2016/054223
§ 371 (c)(1),
(2) Date: Feb. 15, 2019

(87) PCT Pub. No.: WO2018/063196
PCT Pub. Date: Apr. 5, 2018

(65) Prior Publication Data
US 2019/0214369 A1    Jul. 11, 2019

(51) Int. Cl.
*H01L 25/065* (2006.01)
*H01L 23/498* (2006.01)
(Continued)

(52) U.S. Cl.
CPC .......... *H01L 25/0657* (2013.01); *H01L 23/00* (2013.01); *H01L 23/31* (2013.01);
(Continued)

(58) Field of Classification Search
CPC .................................................. H01L 25/0657
See application file for complete search history.

(56) References Cited

U.S. PATENT DOCUMENTS

2011/0175215 A1 *   7/2011   Farooq ................. H01L 23/481
                                              257/686
2011/0204499 A1     8/2011   Lee
(Continued)

FOREIGN PATENT DOCUMENTS

WO     WO 2016/048347    *   3/2016

OTHER PUBLICATIONS

International Preliminary Report on Patentability for International Patent Application No. PCT/US2016/54223, dated Apr. 11, 2019, 10 pgs.

(Continued)

*Primary Examiner* — Walter H Swanson
(74) *Attorney, Agent, or Firm* — Schwabe, Williamson & Wyatt P.C.

(57) ABSTRACT

In accordance with disclosed embodiments, there are provided methods, systems, and apparatuses for implementing reduced height semiconductor packages for mobile electronics. For instance, there is disclosed in accordance with one embodiment a stacked die package having therein a bottom functional silicon die; a recess formed within the bottom functional silicon die by a thinning etch partially reducing a vertical height of the bottom functional silicon die at the recess; and a top component positioned at least partially within the recess formed within the bottom functional silicon die. Other related embodiments are disclosed.

25 Claims, 18 Drawing Sheets

(51) Int. Cl.
  *H01L 23/00* (2006.01)
  *H01L 29/06* (2006.01)
  *H01L 23/31* (2006.01)

(52) U.S. Cl.
  CPC ........ *H01L 23/49816* (2013.01); *H01L 24/24* (2013.01); *H01L 24/73* (2013.01); *H01L 29/0657* (2013.01); *H01L 24/16* (2013.01); *H01L 24/48* (2013.01); *H01L 2224/05* (2013.01); *H01L 2224/13025* (2013.01); *H01L 2224/16227* (2013.01); *H01L 2224/244* (2013.01); *H01L 2224/24051* (2013.01); *H01L 2224/24147* (2013.01); *H01L 2224/32145* (2013.01); *H01L 2224/32225* (2013.01); *H01L 2224/48091* (2013.01); *H01L 2224/48148* (2013.01); *H01L 2224/48227* (2013.01); *H01L 2224/73204* (2013.01); *H01L 2224/73257* (2013.01); *H01L 2224/73259* (2013.01); *H01L 2224/73265* (2013.01); *H01L 2224/97* (2013.01); *H01L 2225/0651* (2013.01); *H01L 2225/06506* (2013.01); *H01L 2225/06517* (2013.01); *H01L 2225/06541* (2013.01); *H01L 2225/06544* (2013.01); *H01L 2225/06555* (2013.01); *H01L 2924/10158* (2013.01); *H01L 2924/13091* (2013.01); *H01L 2924/15311* (2013.01)

(56) References Cited

U.S. PATENT DOCUMENTS

| | | |
|---|---|---|
| 2013/0016477 A1 | 1/2013 | Yokoya et al. |
| 2013/0154117 A1 | 6/2013 | Tan et al. |
| 2013/0228917 A1 | 9/2013 | Yoon et al. |
| 2014/0355234 A1 | 12/2014 | Buuck |
| 2015/0221625 A1* | 8/2015 | Chun .................... H01L 23/367 257/707 |

OTHER PUBLICATIONS

International Search Report and Written Opinion for International Patent Application No. PCT/US2016/054223 dated Jun. 7, 2017, 14 pgs.

* cited by examiner

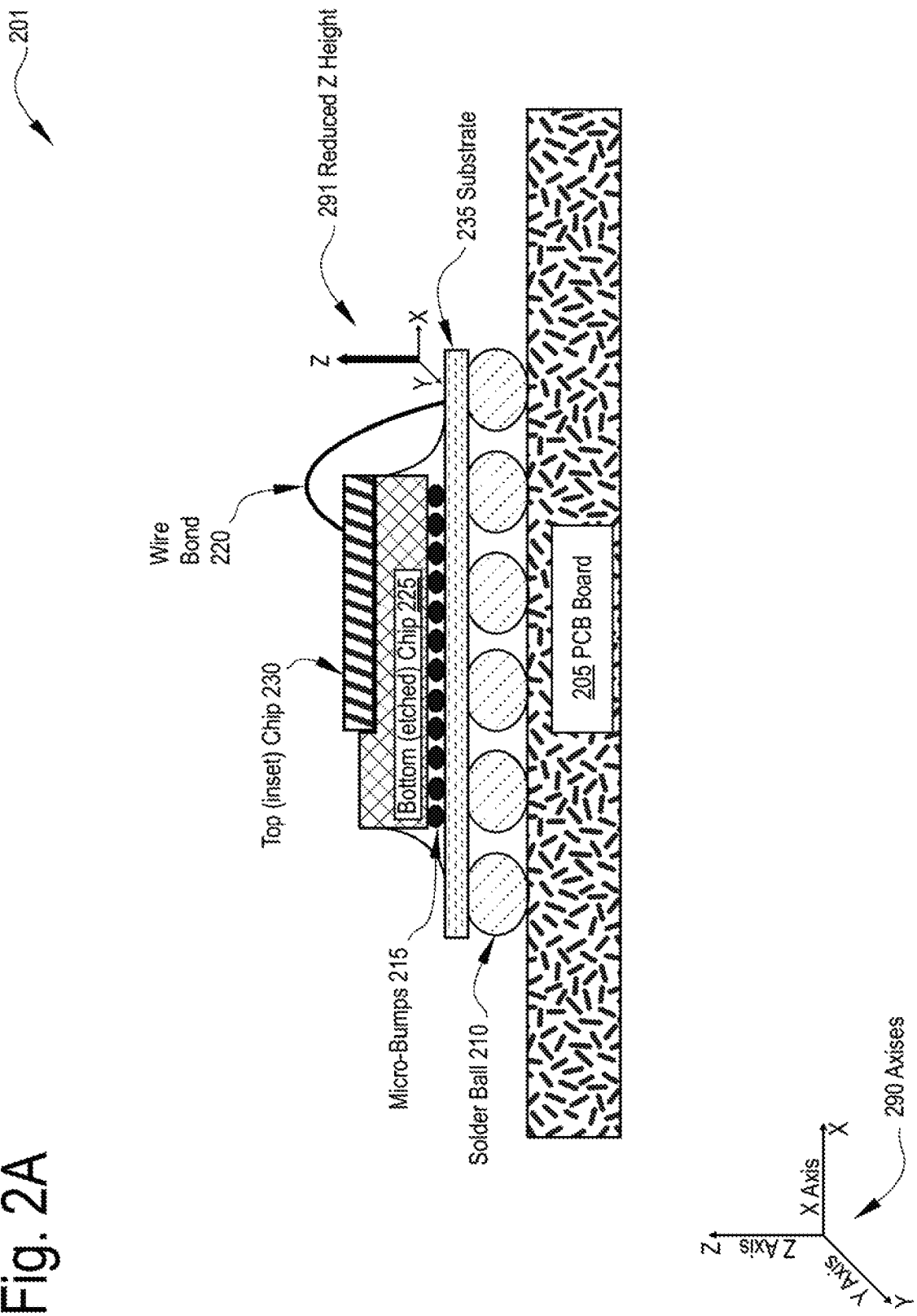

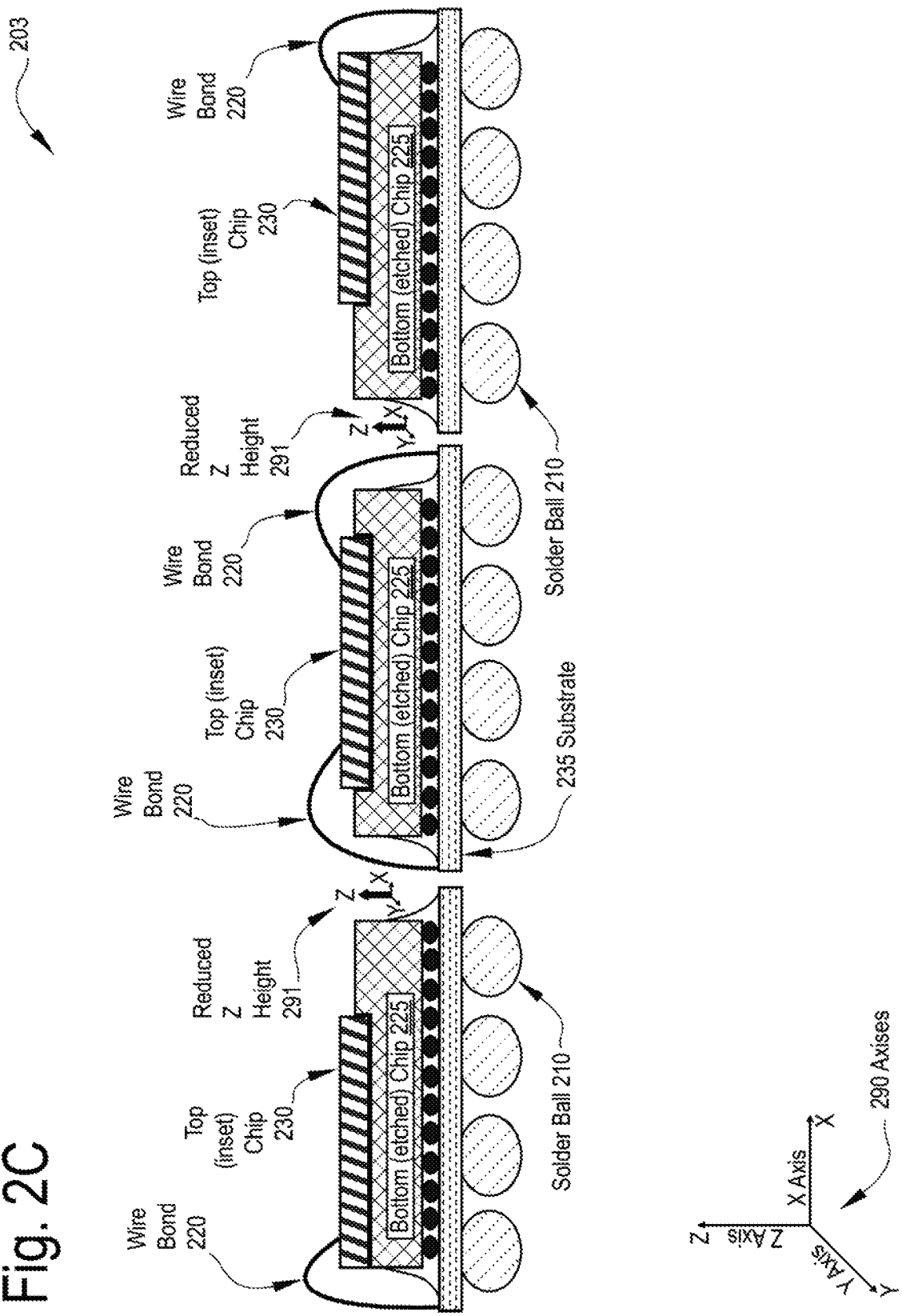

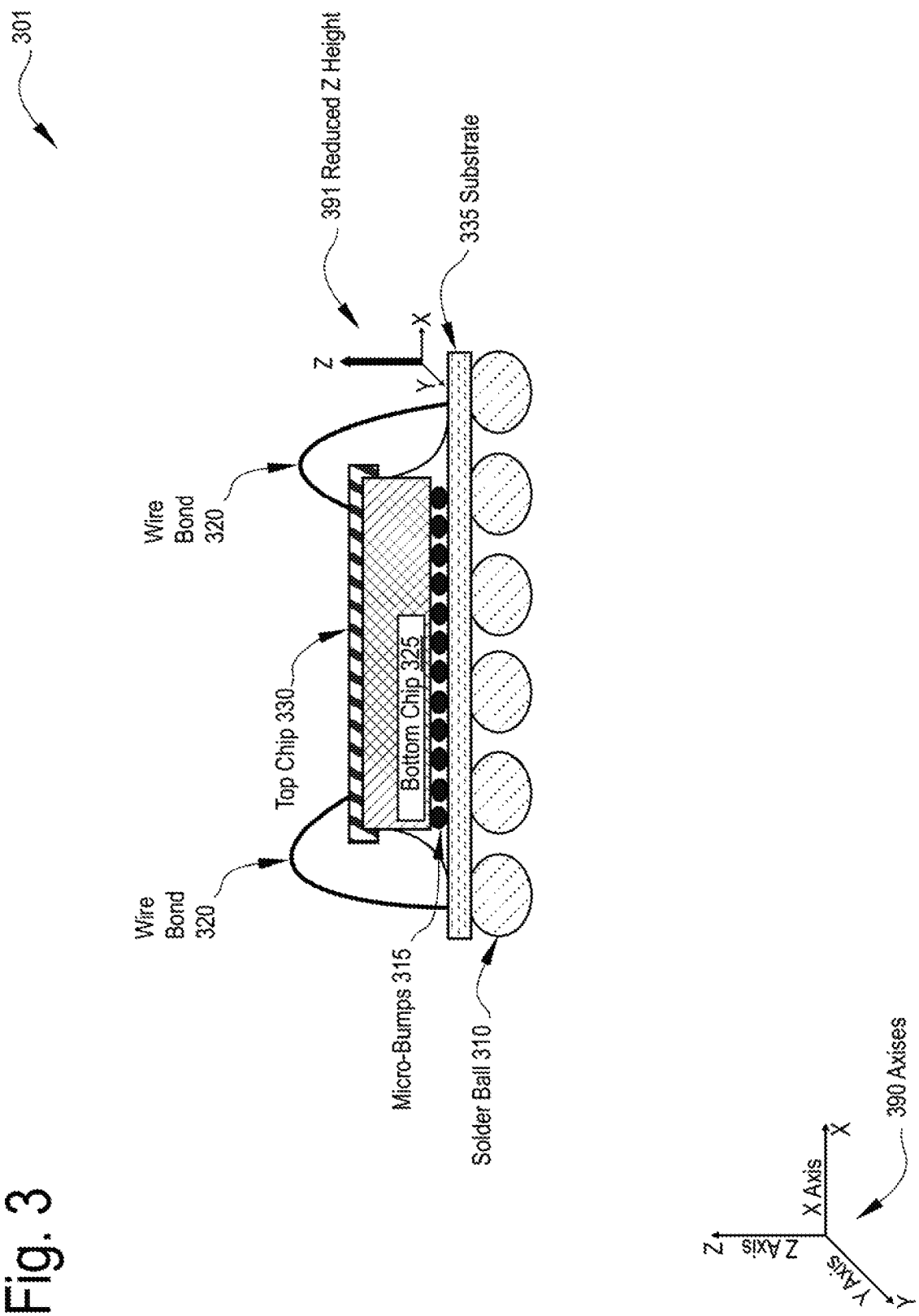

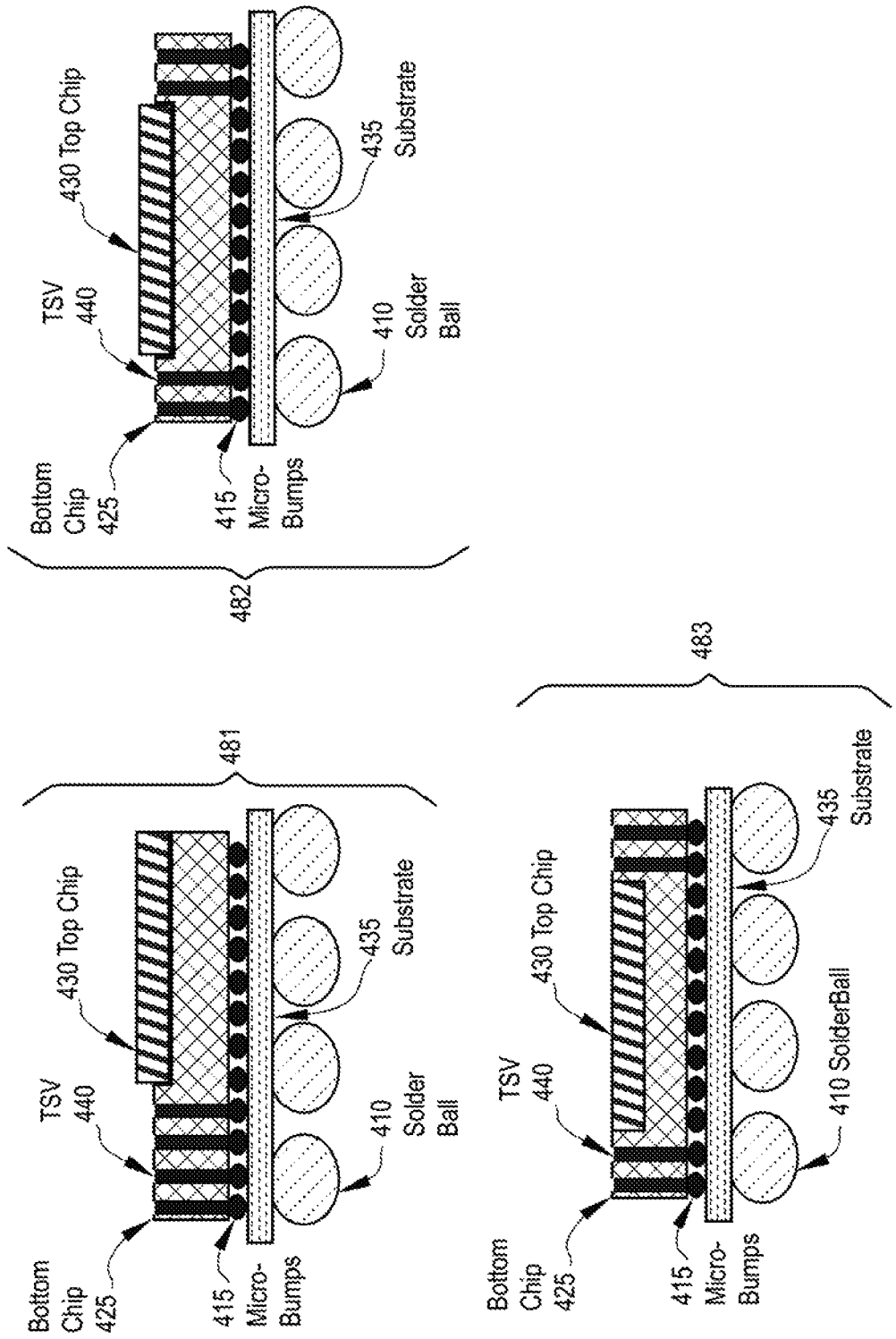

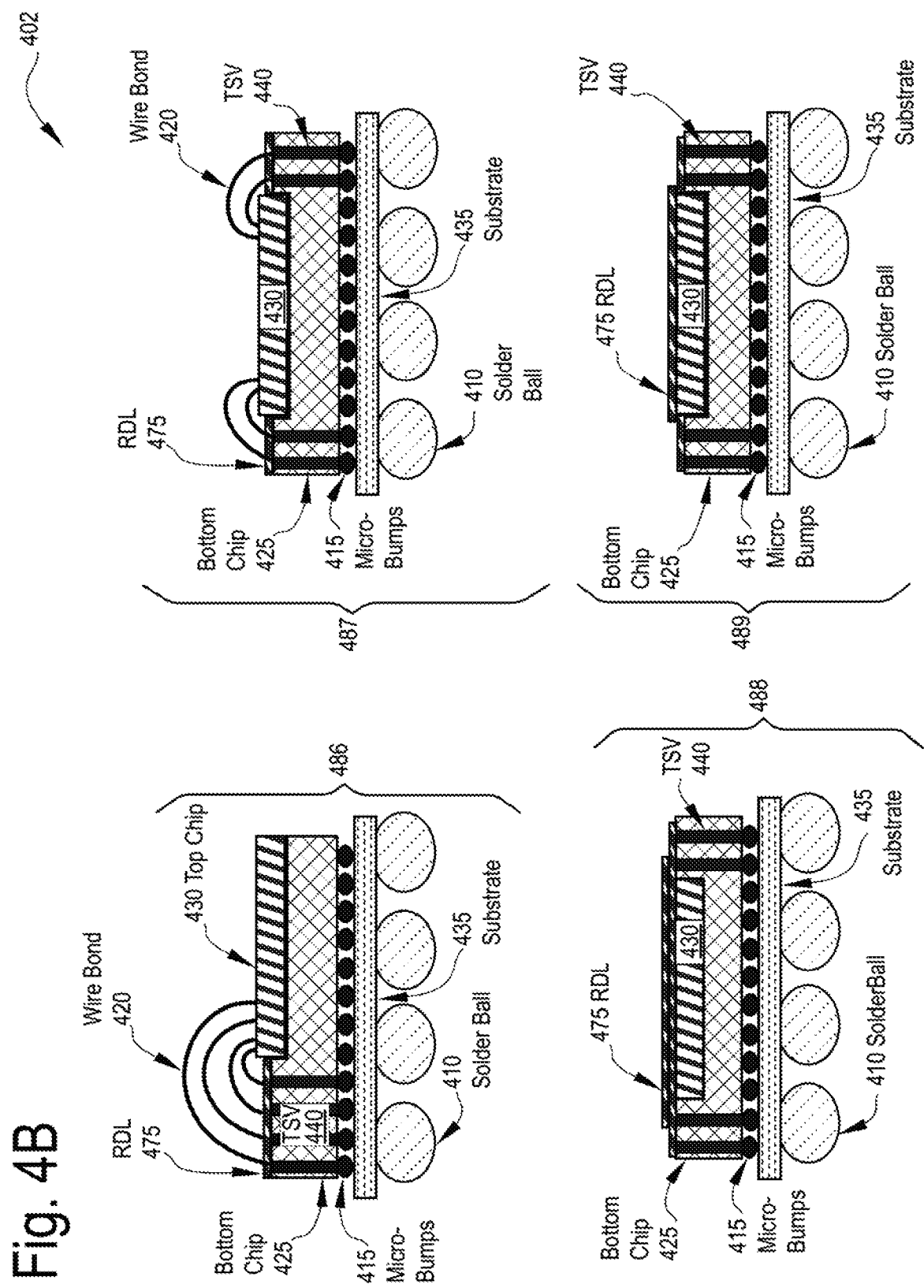

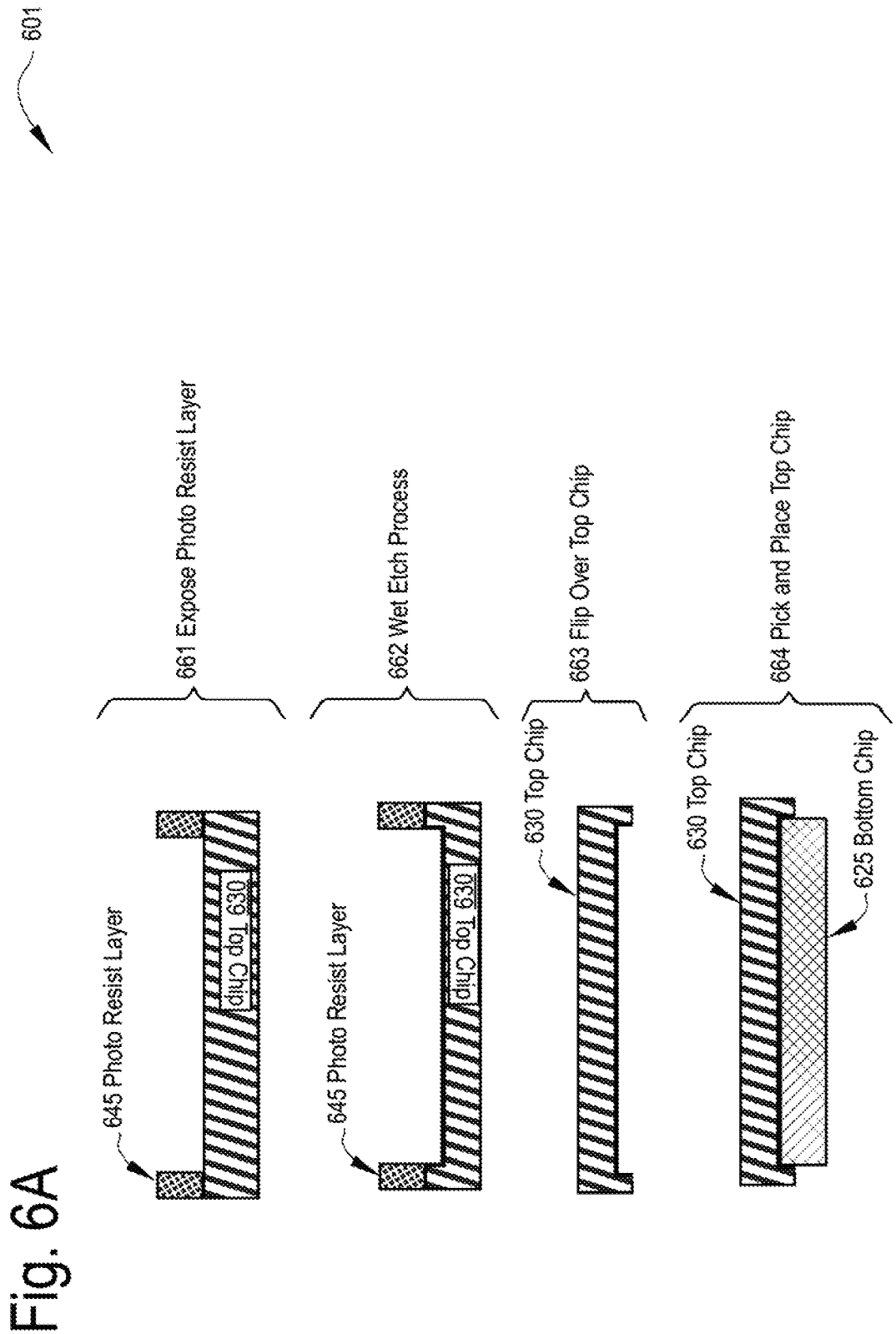

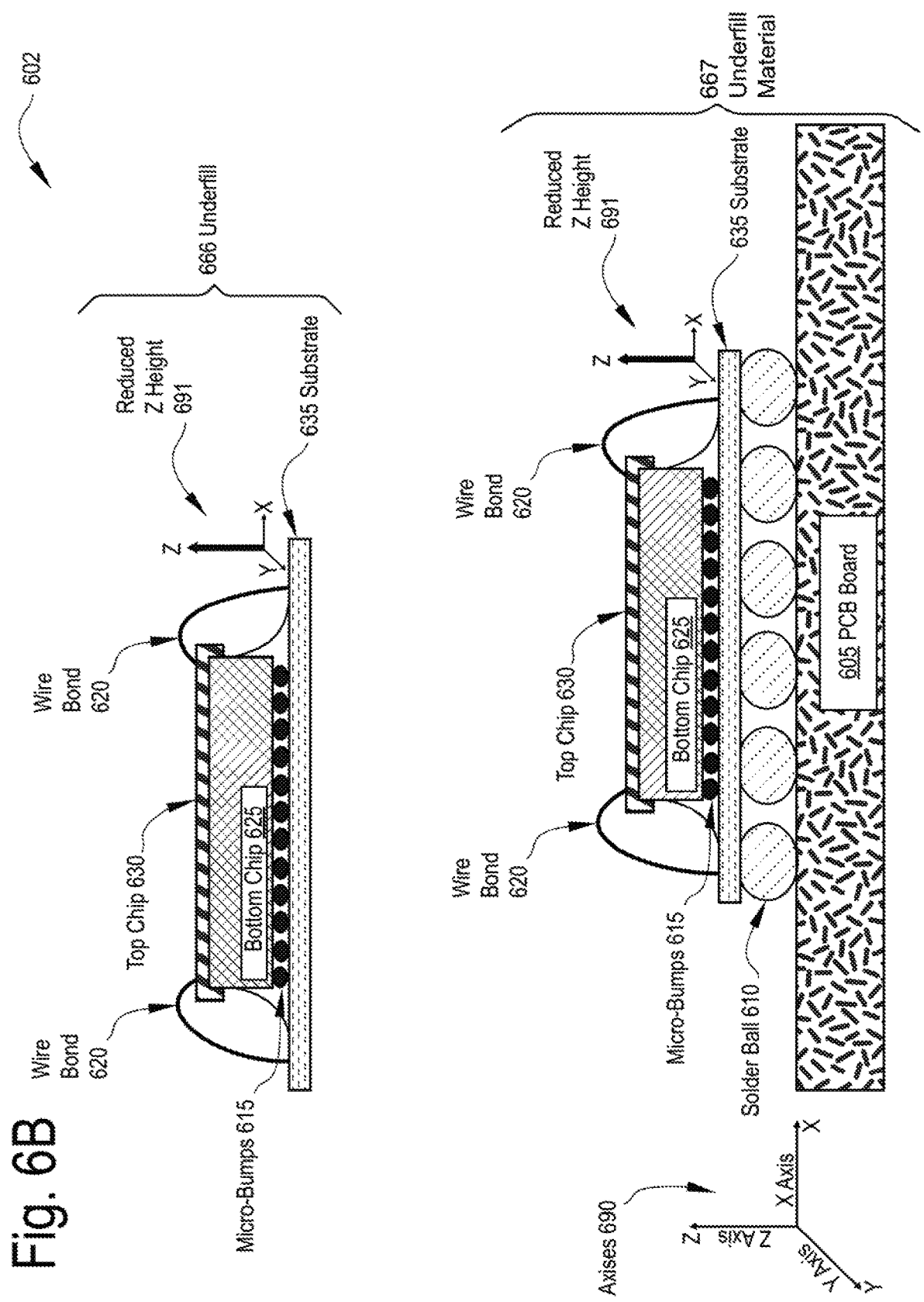

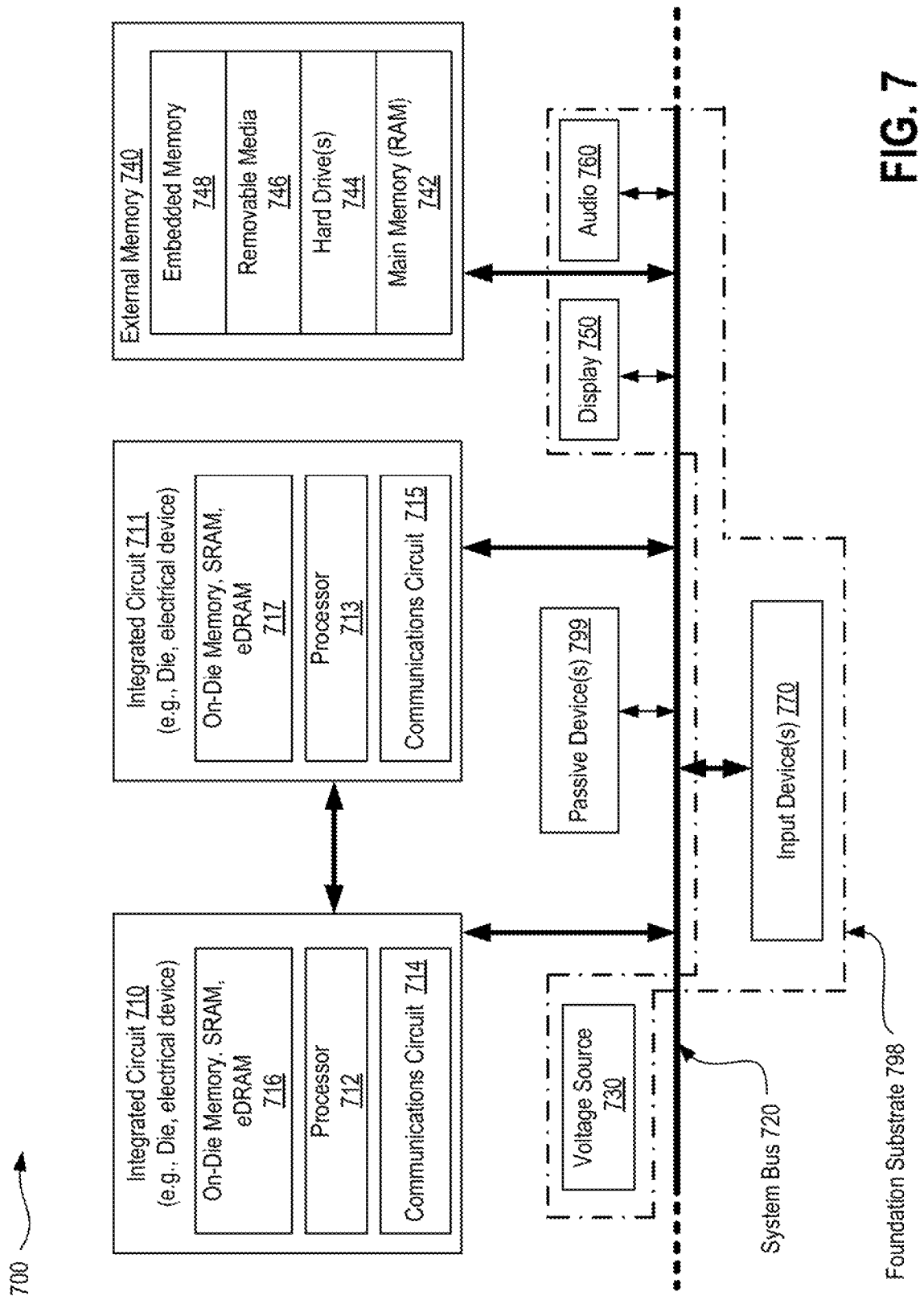

SYSTEMS, METHODS, AND APPARATUSES FOR IMPLEMENTING REDUCED HEIGHT SEMICONDUCTOR PACKAGES FOR MOBILE ELECTRONICS

CROSS-REFERENCE TO RELATED APPLICATION

This patent application is a U.S. National Phase Application under 35 U.S.C. § 371 of International Application No. PCT/US2016/054223, filed Sep. 28, 2016, entitled "SYSTEMS, METHODS, AND APPARATUSES FOR IMPLEMENTING REDUCED HEIGHT SEMICONDUCTOR PACKAGES FOR MOBILE ELECTRONICS," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for implementing reduced height semiconductor packages for mobile electronics.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

In semiconductor manufacturing there is a constant drive to decrease the size of the manufactured semiconductor devices and semiconductor packages which ultimately are placed into consumer electronics such as smart phones, tablets, wearables, and so forth.

Package height of a semiconductor device is a critical driver for mobile application applications, especially with respect to portable consumer electronics such as smart phones, smart watches, wearables, and so forth. Reduction of semiconductor height translates directly to the ability to produce and manufacture thinner devices, such as thinner smart phones.

Characteristics such as how thin a mobile device or smart phone is compared to other competing products in the marketplace is very often a key consideration for consumers looking to purchase such devices.

The present state of the art may therefore benefit from the means for implementing reduced height semiconductor packages for mobile electronics as described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 2A depicts an alternative exemplary semiconductor package having a reduced height in accordance with described embodiments;

FIG. 2C depicts additional alternative exemplary semiconductor packages, each having a reduced height, in accordance with described embodiments;

FIG. 3 depicts another alternative exemplary semiconductor package having a reduced height in accordance with described embodiments;

FIG. 4A depicts alternative exemplary semiconductor packages, each having a reduced height in accordance with described embodiments;

FIG. 4B depicts additional alternative exemplary semiconductor packages, each having a reduced height in accordance with described embodiments;

FIG. 6A depicts an alternative process flow for the non-planar stacking of an overlapping top chip onto a bottom chip;

FIG. 6B depicts a continuation process flow for a non-planar and overlapping top chip;

FIG. 7 is a schematic of a computer system in accordance with described embodiments;

DETAILED DESCRIPTION

Figure 1:
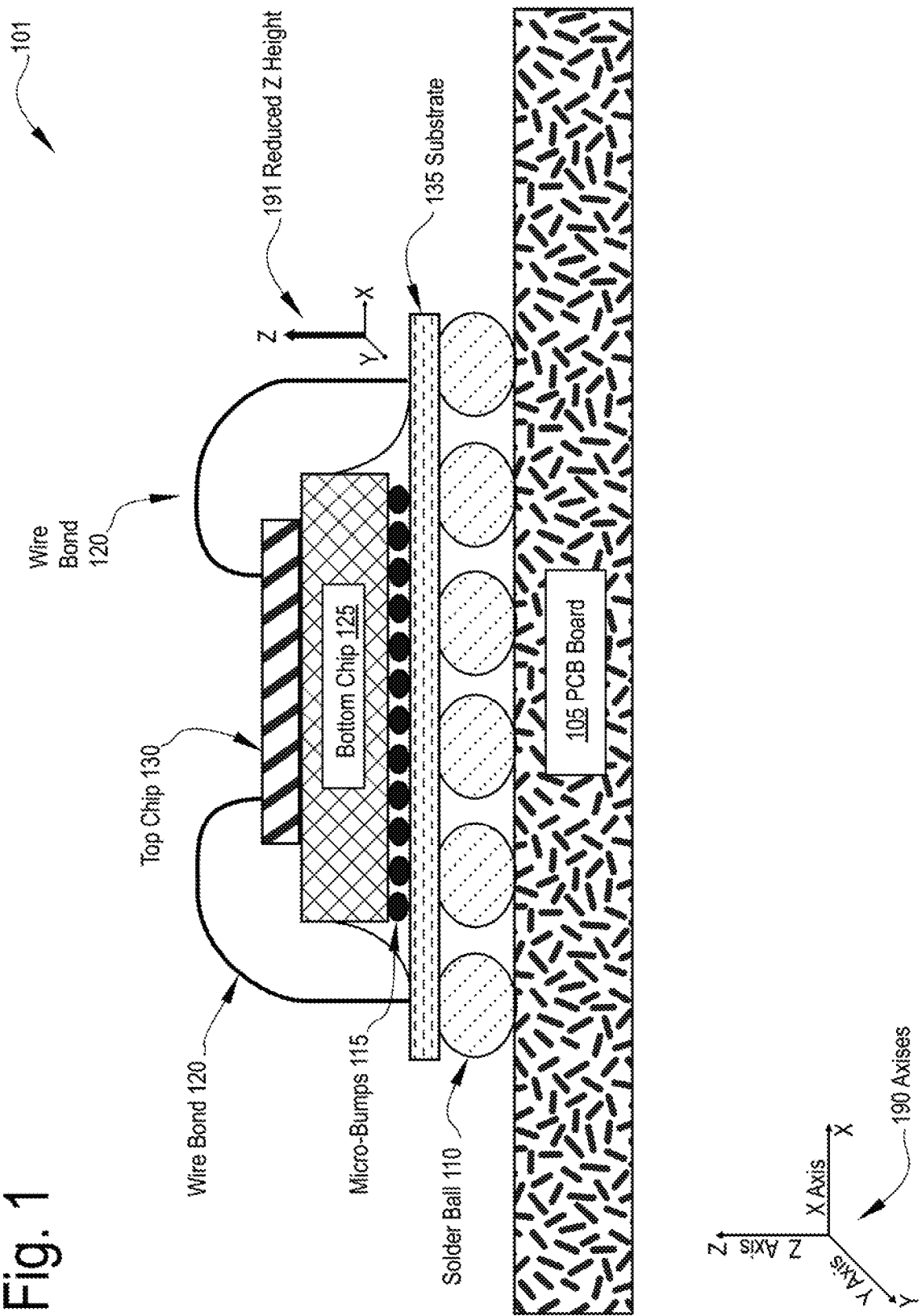
FIG. 1 depicts an exemplary planar hybrid stack for a semiconductor package in accordance with which embodiments may operate.

Described herein are systems, methods, and apparatuses for implementing reduced height semiconductor packages for mobile electronics. For instance, there is disclosed in accordance with one embodiment a stacked die package having therein a bottom functional silicon die; a recess formed within the bottom functional silicon die by a thinning etch partially reducing a vertical height of the bottom functional silicon die at the recess; and a top component positioned at least partially within the recess formed within the bottom functional silicon die.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to in the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. However, with every shrink of line width in the Front End (FE) such operation voltages are reduced. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV or lower for devices having smaller line widths.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (Sift), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 depicts an exemplary planar hybrid stack for a semiconductor package 101 in accordance with which embodiments may operate.

In particular, there is depicted various elements making up the semiconductor package 101 including the PCB board 105, solder balls 110 electrically interfacing the PCB board 105 with the substrate 135 of the semiconductor package, micro-bumps 115 electrically interfacing the bottom chip 125 to the substrate 135, a top chip 130 (e.g., a top functional silicon die) placed atop the bottom chip 125 (e.g. a bottom functional silicon die), in which the top chip 130 is electrically interfaced to the substrate 135 via wire bonds 120.

Moreover, as is depicted via the axises 190 in the z, y, and x dimensions, the depicted semiconductor package 101 exhibits a reduced height 191 due to the stacking of the top chip upon the bottom chip within the semiconductor package 101 formed from both the top functional silicon die and the bottom functional silicon die (e.g., the top chip and the bottom chip).

FIG. 2A depicts an alternative exemplary semiconductor package 201 having a reduced height in accordance with described embodiments.

In particular, it can be seen within the semiconductor package 201 the further reduction in height 291 due to the top (inset) chip 230 being recessed within a cutaway portion of the bottom (etched) chip 225, causing a portion of the vertical height of the top chip 230 to be recessed within a portion of the vertical height of the bottom chip 225. Axises 290 are depicted in the bottom left showing the reduction in height 291 of the semiconductor package 201. As depicted here, the top chip 230 is recessed within a laterally right recess (on the x axis) of the bottom chip 225.

As before, the bottom chip is electrically interfaced to the substrate 235 via micro-bumps and the top chip 230 is electrically interfaced with the substrate 235 via wire bonds. The substrate 235 in turn is electrically interfaced with the PCB board 205 via the solder balls 210.

Providing a reduced height 291 (in the Z or vertical axis) directly translates to the ability to build thinner consumer products such as thinner smart phones, tablets, watches, and other wearables.

To achieve such a result there are varying solutions such as thin PoP, or stacked chip solutions. Thin PoP or "Package on package" technology is an integrated circuit packaging method to combine vertically discrete logic and memory ball grid array (BGA) packages. Two or more packages are installed atop each other, that is to say, they are stacked, with electrical conductivity or electrical interfaces to route signals between them. Such technologies allow for higher component density in devices, such as mobile phones, personal digital assistants (PDA), and digital cameras, etc.

For PoP and stacked chip solutions, including the hybrid stacks as depicted here, the achievable minimum height (e.g., on the Z or vertical axis as depicted) depends upon equipment and process tolerances for operations such as grinding, handling, board assembly, etc., which ultimately lead to a variety of minimum height limitations. According to certain embodiments, a hybrid stack is built by putting two discrete semiconductor dies (e.g., logic dies, memory dies, etc.) backside to backside and electrically interfacing the contact pads of the semiconductors to one side using BGA, wire bond, or TSV technologies, or a combination of electrical interfacing means.

According to described embodiments, so as to attain a further reduced height 291, of a hybrid semiconductor package stack a wet etching or dry etching process is performed to form a recess locally into the bottom chip 225 backside, into which the top chip 230 is then placed.

By placing the top chip 230 into a wet or dry etched recess formed into the bottom chip 225 a further reduction in height 291 may then be realized for the stacked die semiconductor package while maintaining stability for the stacked die semiconductor package.

As can be seen, the bottom die or bottom chip 225 of a hybrid stacked semiconductor package with an open backside is etched to form a local opening or a local recess to receive the top die or top chip 230.

So as to accomplish the etch, a resist is added with a local opening where the recess is to be formed and then after exposure the local recess is wet or dry etched into the backside of the bottom chip 225.

After removal of the resist, the top die or top chip 230 may thus be placed into the recess formed in the backside of the bottom chip 230.

According to certain embodiments, the etch is performed at the single die level or may alternatively be performed at the wafer level for multiple dies or multiple bottom chips simultaneously prior to chip singulation (e.g., prior to separation of the discrete chips from the wafer).

Unlike prior solutions which sought reduced height (in the Z or vertical axis) by thinning the entity of the backside of the bottom chip 225, the localized etch does not introduce handling issues and therefore the process may be utilized with current chip handling procedures without retooling. Additionally, mass-reflow may be utilized. Mass-reflow soldering is the process by which a solder paste is used to temporarily attach several electrical components to their contact pads, after which the entire assembly is subjected to controlled heat, which melts the solder, permanently connecting the joint, for instance, by passing the semiconductor package assembly through a reflow oven.

Etching processing may vary per design considerations. For instance, according to described embodiments, a wet chemistry etch or an ion etching process for etching the localized recess may be implemented to avoids sharp edges, which make the silicon die susceptible to fracture.

According to certain embodiments, wet chemistry etch using a resist is preferable as it represents an established process in the frontend and further because the wet etch process can also be reused in the package backend processing. Ion etching with a resist may be preferred in other embodiments where the ion etch is the established process for a given product's manufacture. Described embodiments are not limited to either technology.

Figure 2B:
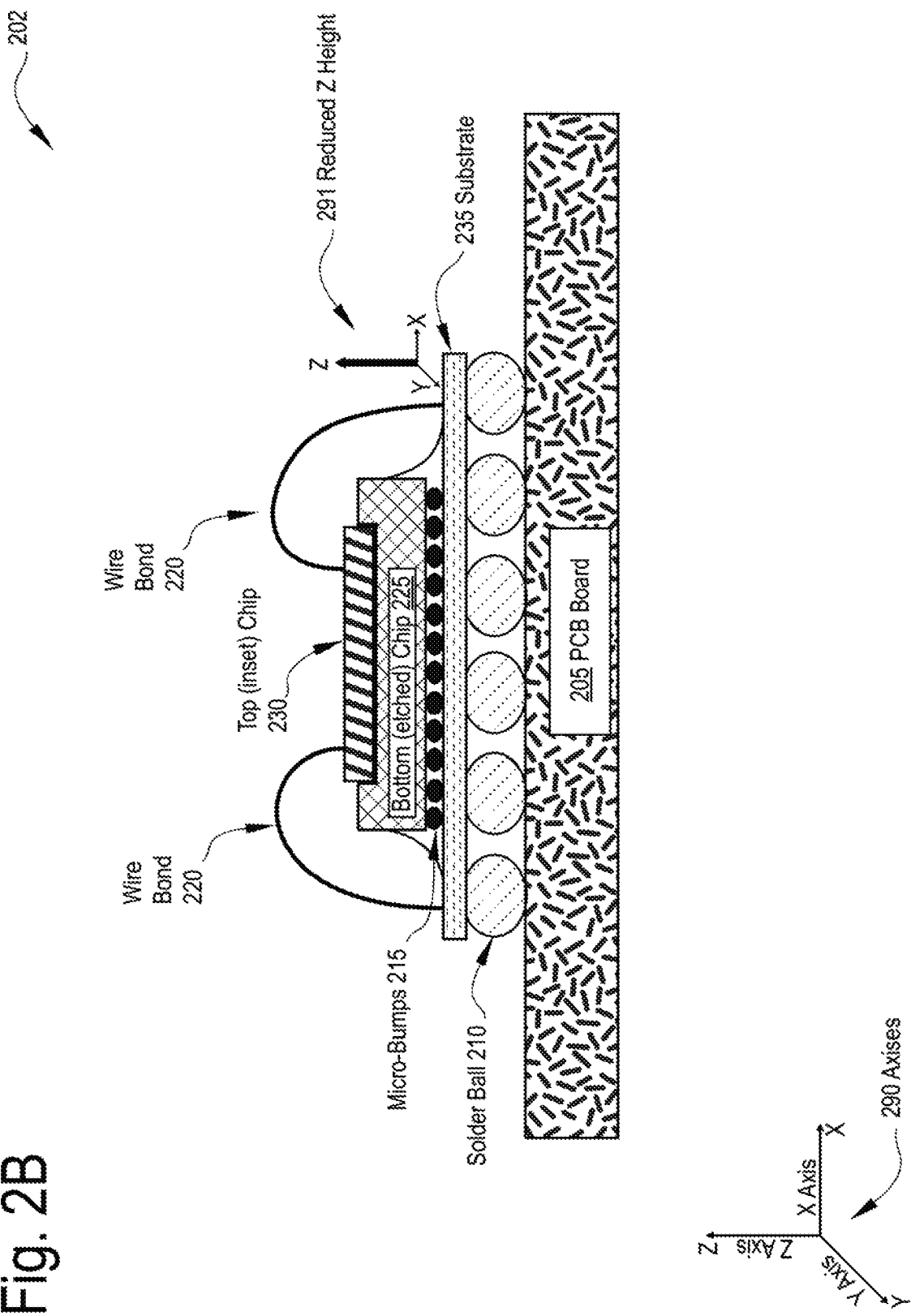
FIG. 2B depicts another alternative exemplary semiconductor package having a reduced height in accordance with described embodiments.

FIG. 2B depicts another alternative exemplary semiconductor package 202 having a reduced height in accordance with described embodiments.

As can be seen here, the top (inset) chip 230 is now recessed within a center portion of the bottom (etched) chip 225 providing for a reduction in height 291. As before, there is electrical connectivity from the top chip 230 to the substrate 235 via the wire bonds 220 and there is electrical connectivity from the bottom chip 225 to the substrate 235 via the micro-bumps 215, with the substrate 235 being electrically interfaced with the PCB board 205 via the solder balls 210.

FIG. 2C depicts additional alternative exemplary semiconductor packages 203, each having a reduced height, in accordance with described embodiments. As can be seen here, a reduction in height 291 is attainable by recessing the top chip 230 into a recessed portion of the bottom chip 225, while maintaining electrical connectivity necessary for functioning of the functional semiconductor devices (e.g., the top inset chip and the bottom etched chip) to the substrate via the wire bonds and the micro-bumps respectively. The recess of the bottom chip may be present at a lateral left side (on the x axis) on the lateral right side, in the center, aligned to the lateral left, aligned to the lateral right, or offset to create an overhang from the lateral left or right or inset to create a setback from the lateral left or right.

Placement of the top chip within the recess of the bottom chip may be varied according to design considerations.

Reducing the thickness of functional silicon dies (e.g., chips or semiconductor chips or semiconductor dies) through a process such as grinding will result in a thinner semiconductor package when the chips are ultimately stacked, however, grinding or thinning greatly increases the risk of fracture since the thinned dies are more brittle and therefore more susceptible to breaking.

By reducing the thickness of the dies at a localized area to create a recess as is shown here, the total height of the semiconductor package may be reduced by placing another smaller functional silicon die within the recess formed within a larger functional silicon die.

FIG. 3 depicts another alternative exemplary semiconductor package 301 having a reduced height in accordance with described embodiments.

As can be seen here, the bottom chip 325 is no longer etched and thus no longer possesses a recess for the top chip 330. Rather, the top chip 330 has been elongated to fully encompass the width of the bottom chip 325 and overhang the bottom chip 325. As depicted, the bottom chip 325 is not etched and has no recess, but the top chip now is now etched and thus exhibits a recess within which the bottom chip may be placed or as the inset chip. Alternatively, the top chip 330 having been etched to form the recess may be placed over the bottom chip 325, thus enabling the reduction in height 391 as the height of the bottom chip 325 is inset and now resides within a portion of the height of the top chip as permitted by the recess made within the top chip 330. Axes 390 are depicted in the bottom left showing the reduction in height 391 of the semiconductor package 301.

As before, there is electrical connectivity from the top chip 330 to the substrate 335 via wire bonds 320 and there is electrical connectivity from the bottom chip 325 to the substrate 335 via the micro-bumps 315. The substrate in turn is electrically interfaced with the solder balls 310 which may then be connected with another device, such as a PCB motherboard, main board, circuit board, etc., so as to provide a completed electrical and therefore functional communications path from each of the top chip 330 and the bottom chip 325 despite the semiconductor package 301 having a total reduced height 391 (in the Z or vertical axis).

FIG. 4A depicts alternative exemplary semiconductor packages 401, each having a reduced height in accordance with described embodiments.

As can be seen here, there are varying methodologies by which the electrical connectivity between a top chip 430 and the bottom chip 425 is attainable.

On the top left at semiconductor package 481, the top chip is recessed within a lateral right (on the x axis) portion of the bottom chip 425. However, there are no longer wire bonds connecting the top chip 430 to the substrate 435. Rather, TSVs 440 are utilized to provide electrical connectivity from the top chip 430 through the bottom chip 425 and to micro-bumps 415 which are electrically interfaced to the substrate 435. The bottom chip 425 is likewise electrically interfaced to the substrate 435 by way of the micro-bumps 415. As depicted here, all the TSVs 440 are positioned on the lateral left side of the bottom chip to make room for the recess within the bottom chip 425 to accept the top chip 430.

In semiconductor manufacturing, such as the manufacture of semiconductor packages and semiconductor devices, there exists a need to create through-silicon vias (TSVs) through the substrate or through other materials such as through the bottom chip 425 as depicted here. So called "vias" are typically vertical electrical connections, hence the term "via" which pass completely through a silicon wafer or die such as the bottom chip 425. Use of such vias may be called upon as either an alternative to wire-bond and flip chip technologies or even supplement such technologies in the manufacturing of semiconductor devices including three-dimensional (3D) semiconductor packages, 3D integrated circuits, System on Chip (SoC) semiconductor devices, and related semiconductor components. Use of vias provides for a greater circuit density and additionally permits connections which are shorter in length.

Moving to the semiconductor package 482 depicted at the top right it can be seen that the top chip 430 resides within a laterally centered (on the x axis) recessed portion of the bottom chip 425. Here the electrical connectivity from the top chip 430 to the substrate is again accomplished through a continuous metallic electrical path from contact pads at the top chip 430 to the TSVs 440 down through the bottom chip 425 and to the substrate 435 through the micro-bumps 415. However, as can be seen, there are TSVs 440 located both laterally left and laterally right (on the horizontal planar axis) from the top chip 430. Stated differently the recess of the bottom chip which accepts the top chip is in-between TSVs 440 through the bottom chip 425. As before, the solder balls 410 provide electrical connectivity from the substrate 435 which is connected with each of the top and bottom chips to another device, board, component, or interface, such as a main board or a mother board, etc.

Notably, the top chip 430 is partially but not fully recessed within the vertical height of the bottom chip 425. Consequently, there is a reduction in height but the top chip 430 does partially protrude from the top surface of the bottom chip 425.

Moving now to the bottom left it may be observed that semiconductor package 483 has a top chip 430 which is fully recessed within the vertical height of the bottom chip, such that a top surface of the top chip is flush with the top surface of the bottom chip as the top chip is fully encompassed within the recess formed within the bottom chip 425. In such a way, still greater reduction in vertical height is attainable.

As before, TSVs 440 provide electrical connectivity from the top chip 430 to the substrate 435 through the bottom chip to the micro-bumps 415 and to the substrate 435.

FIG. 4B depicts additional alternative exemplary semiconductor packages 402, each having a reduced height in accordance with described embodiments.

As can be seen here on the top left at semiconductor package 486, there is the top chip 430 which is partially recessed within the height of the bottom chip 425 at the lateral right (on the horizontal axis) side of the bottom chip 425. As depicted, electrical connectivity achieved from contacts of the top chip 430 to the TSVs 440 by way of wire bonds 420. However, other means are equally permissible.

Moving to the top right there is depicted the semiconductor package 487 in which the top chip 430 is partially recessed within the height of the bottom chip 425 and is positioned in a centered portion of the bottom chip 425. Wire bonds 420 provide electrical connectivity from the contacts of the top chip 430 to the substrate 435 through the TSVs 440 provided through the bottom chip at the lateral left and right sides from the recess of the bottom chip 425.

Moving to the bottom left at semiconductor package 488 it may now be observed that there is a top chip 430 having been fully set into and therefore fully encompassed within the height of the bottom chip 425. Specifically, the full height of the top chip 430 resides within the height of the bottom chip 425 with no protrusion of the top chip 430 from the top of the bottom chip 425. Due to the tolerances of the recess etch and the top die there may also exist a gap to be filled up before buildup of the RDL. Such a gap may be filled during the die attached glue operation.

Rather than wire bonds being utilized for electrical connectivity from the contacts of the top chip to the TSVs 440 through the bottom chip 425, RDL connectivity is instead provided, with the RDL contacts providing a complete electrical path from the contacts of the top chip through the RDL 475 interface to the TSVs 440 which then electrically interface the top chip 430 to the substrate via the TSVs 440 to the micro-bumps 415 and ultimately into the substrate 435.

The Re-Distribution Layer (RDL) is an additional metal layer on a chip that re-routes or re-distributes the IO contact pads of an integrated circuit such as the top chip 430 such that connectivity to those contact pads are available in other locations, such as routing or re-distributing the contact pads on the top chip 430 to the TSVs 440 as depicted.

RDL or so-called "Re-Distribution Layer" technology is utilized in semiconductor package designs to redistribute I/O (input/output) pads to bump pads without changing the I/O pad placement. Flip-chip assembly may likewise be utilized with or in place of wire bond connections 420 because it reduces chip area while supporting many more I/Os while also reducing inductance, allowing for high-speed signals, and providing better heat conductivity properties. A Flip-Chip Ball Grid Array (FCBGA) or Copper pillars are often utilized in conjunction therewith for high I/O count chips. For instance, the micro-bumps 415 may form a FCBGA or a Ball Grid Array (BGA) for the substrate 435.

Moving now to the bottom right, it may be observed that the semiconductor package 489 also has an RDL 475 layer providing connectivity from the top chip 430 to the TSVs 440 traversing through the bottom chip 425, however, the top chip 430 is not fully recessed within the height of the bottom chip 425, but rather, is partially recessed and partially protrudes from the top surface of the bottom chip 425. However, the RDL 475 redistribution layer may nevertheless be utilized to provide connectivity from the IO pads of the top chip to the TSVs 440 through the bottom chip to the micro-bumps 415 and into the substrate 435 in the manner depicted.

According to certain embodiments, eWLB or "embedded Wafer Level BGA" and via Bars are instead utilized for electrical connectivity from the contacts of the top chip to the TSVs or substrate. For instance, eWLB flow with a two sided redistribution (RDL) layer provides for multiple possibilities for electrical connection from the top chip with varying height. Moreover, technologies such as TMV, TSV, pre-fabricated via bars (PCB, Si), area array interconnects on the semiconductor package backside likewise may be utilized to provide for a reduced package height.

In an alternative embodiment, the top chip which is inset into the bottom etched chip may be replaced with a copper heat sink or a heat spreader to improve the thermal dissipation characteristics of the semiconductor package.

Figure 5A:
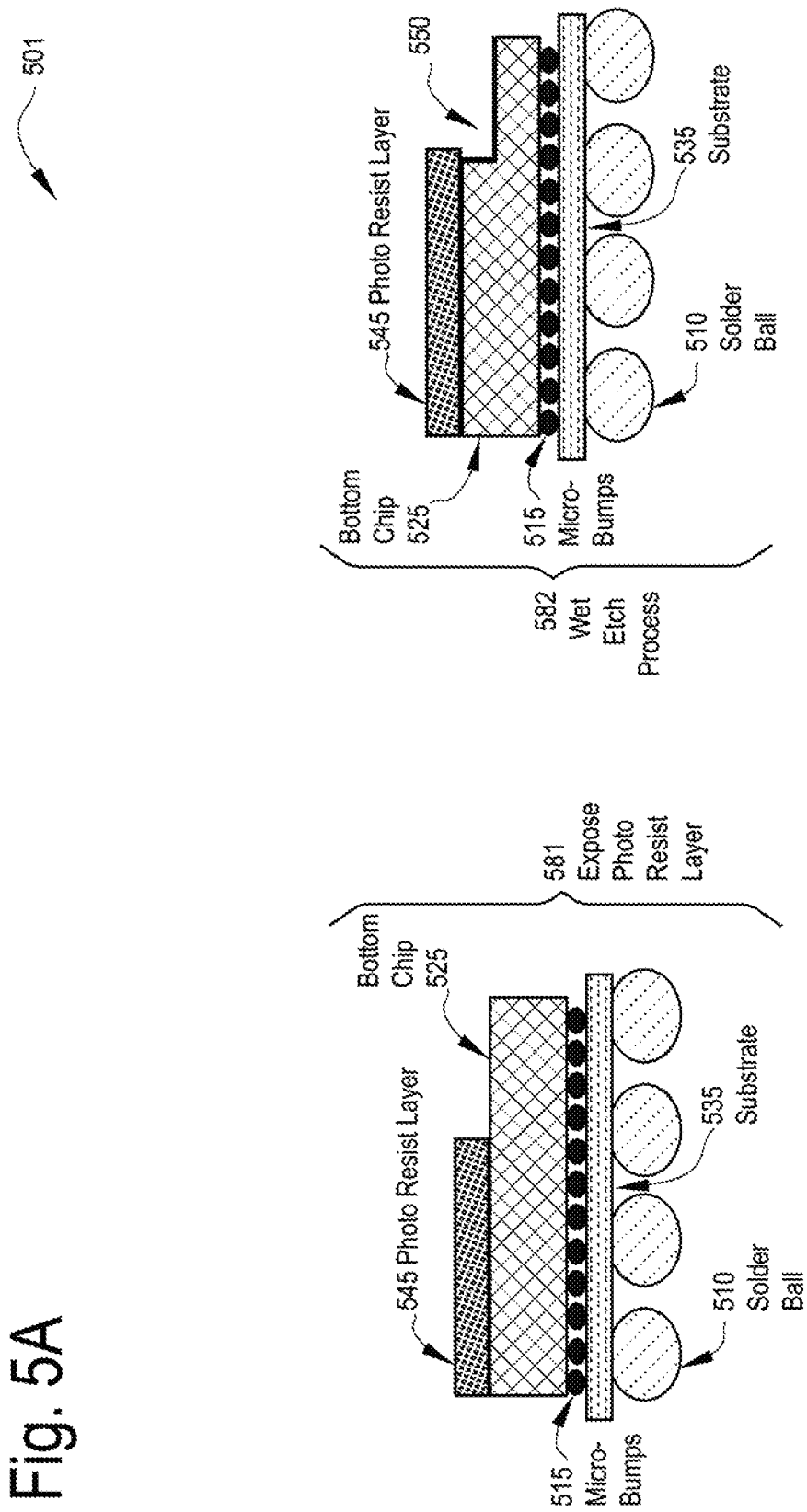
FIG. 5A depicts a process flow for the non-planar stacking of a top chip to a bottom chip with connectivity to a substrate.

FIG. 5A depicts a process flow 501 for the non-planar stacking of a top chip to a bottom chip 525 with connectivity to a substrate 535. As can be seen, there is a bottom chip 525 having a photo resist layer 545 thereupon, the bottom chip electrically interfaced to a substrate 535 via the micro-bumps 515 and the substrate 535 capable of being further electrically interfaced to other components via the solder balls 510.

As depicted at operation 581, the bottom chip 525 is exposed to a photo resist layer 545 and then through a wet etch process 582, a recess 550 is formed into a top surface of the bottom chip 525, the formed recess 550 being capable of receiving a top chip at least partially within the vertical height of the bottom chip 525. Such a recess 550 may also be present under photoresist layer 545 due to the isotropic etch rate of a wet chemistry process. Conversely, if Reactive Ion Etching (RIE) is utilized then a 1:1 edge correspondence with the photoresist will remain as depicted. However, if wet etching chemistry is utilized then a slight undercut of the silicon under the photoresist will result as is depicted at recess 550 having a slight undercut from the photo resist layer 545 above. According to alternative embodiments, etching may be performed at the wafer level, prior to singulation of the functional silicon dies forming bottom chip 525 from the wafer and without the bottom die being attached to any substrate. According to other embodiments the etch is performed at a per-chip level, meaning the bottom chip formed from the functional silicon dies of a wafer has been singulated from the wafer and affixed to a substrate.

Thinning or etching can be done at the wafer level prior to singulation such that a larger photo resist may be utilized to create the localized recesses within many functional silicon dies simultaneously to ease handling and processing burdens. At the time of chip singulation, the resulting separated chips, each separated into discrete functional silicon dies, will therefore already have the localized recess 550 within which they may then receive another smaller or appropriately sized second chip, such as the top chip as is depicted here.

The etching process may be calibrated so as to form the recess within the bottom chips at varying locations and depths, regardless of whether at the wafer level in bulk or individually at the chip level. For instance, as is depicted here and in the figures that follow, the recess may be to the right, left, center, front, back, or anywhere upon the bottom chip which permits a recess to be formed into the bottom chip without affecting functionality of the bottom chip and while maintaining sufficient structural rigidity of the bottom chip.

Varying depths may be accommodated depending on the implementation, some of which permit the top chip to partially recess within the bottom chip and others which permit the top chip to fully recess within the bottom chip, resulting in a planar top surface in which the top non-etched and non-recessed surface of the bottom chip and the top surface of the top chip align when the top chip is placed within the recess of the bottom chip.

According to certain embodiments, a trough is formed into the bottom chip through a photoresist exposure and etch process, in which the open trough is then utilized as the recess of the bottom chip within which the top chip may be placed.

According to particular embodiments, the total thickness (e.g., height) of the semiconductor package including the bottom chip with the recess and the top chip which is placed within the recess is calibrated to design specifications which permit optimal thermal distribution while also mechanically preventing warpage due to the retained non-etched portions of the bottom chip. For instance, the bottom chip may be etched to form a recess which retains sufficiently thick portions to permit optimal heat spreading without permitting the bottom chip to warp or curl as it transitions through varying thermal profiles either in manufacturing or in operation.

According to certain embodiments a wet etch is utilized which avoids the sharp interior angles within the recess. For instance, a wet etch may be utilized to create a recess having inner corners which are sloped or curved and therefore less susceptible to fracture due to the brittle nature of the functional silicon chip being etched.

In other embodiments Reactive Ion Etching (RIE) is utilized to form the recess which results in more squared inner corners and thus permits a tighter bond between the bottom chip and the top chip once placed and affixed to the bottom chip via glue or die attached film.

Figure 5B:
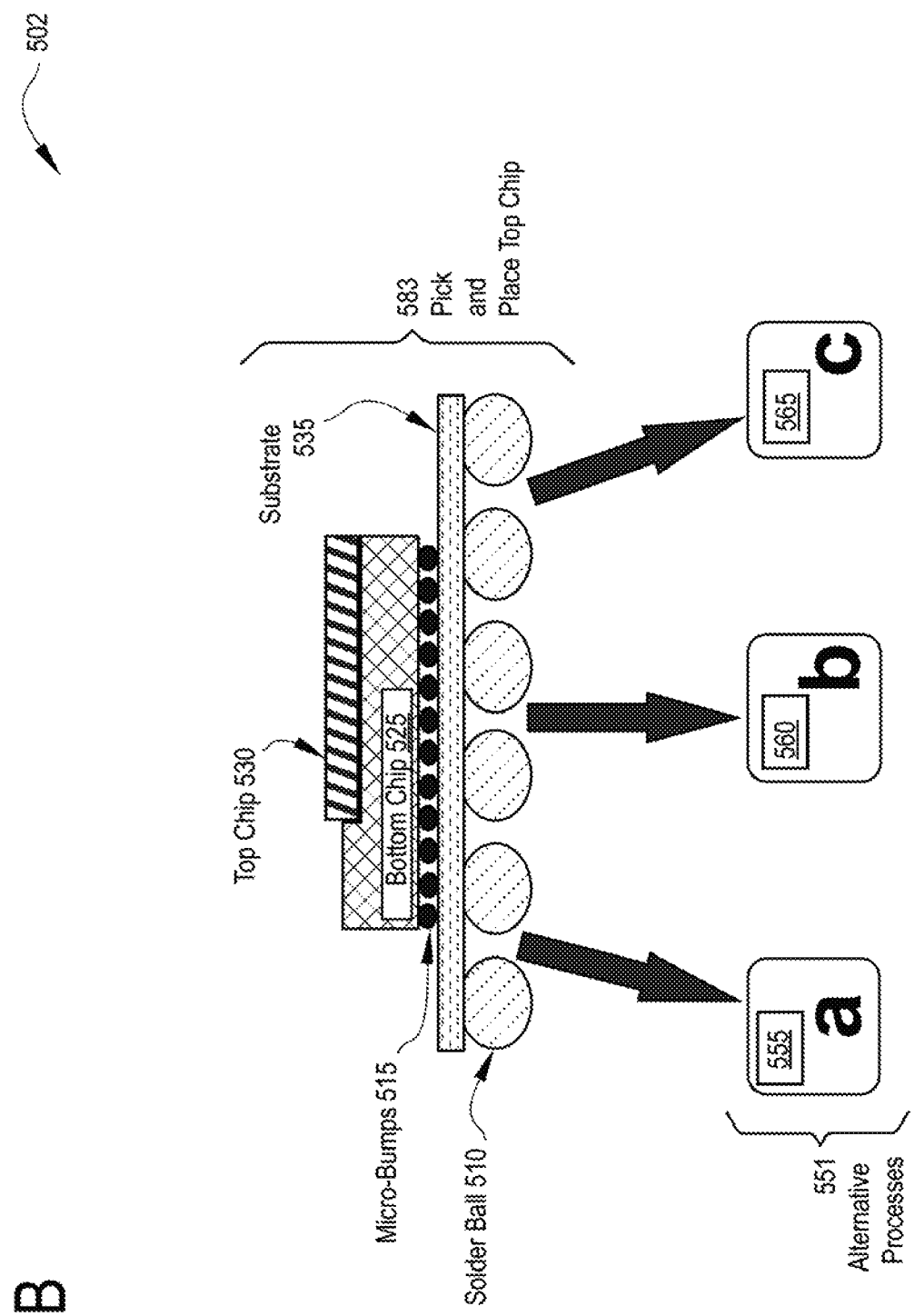
FIG. 5B depicts a continuation process flow for the non-planar stacking of a top chip to a bottom chip with connectivity to a substrate.

FIG. 5B depicts a continuation process flow 502 for the non-planar stacking of a top chip to a bottom chip 525 with connectivity to a substrate 535.

As depicted here, a pick and place operation 583 places the top chip 530 into the formed recess (e.g., element 550 from FIG. 5A) of the bottom chip 525. Although the top chip is depicted as right edge aligned with the bottom chip, it is not necessary to be aligned. Rather, the top chip may overhang the bottom, be aligned to the bottom, be centered with the bottom, or inset from a left or right edge of the bottom. According to a particular embodiment, the top chip 530 is attached to the bottom chip 525 with die attached film.

As can be seen, the top chip 530 is placed within the recess of the bottom chip 525 such that at least part of the height of the top chip is within the vertical height of the bottom chip, thus providing a reduction in height on the vertical axis.

Processing may then deviate to any one of the alternative processes 551 as set forth at alternative processing (a) at element 555, alternative processing (b) at element 560, or alternative processing (c) at element 565, each provided via the figures that follow.

Figure 5C:
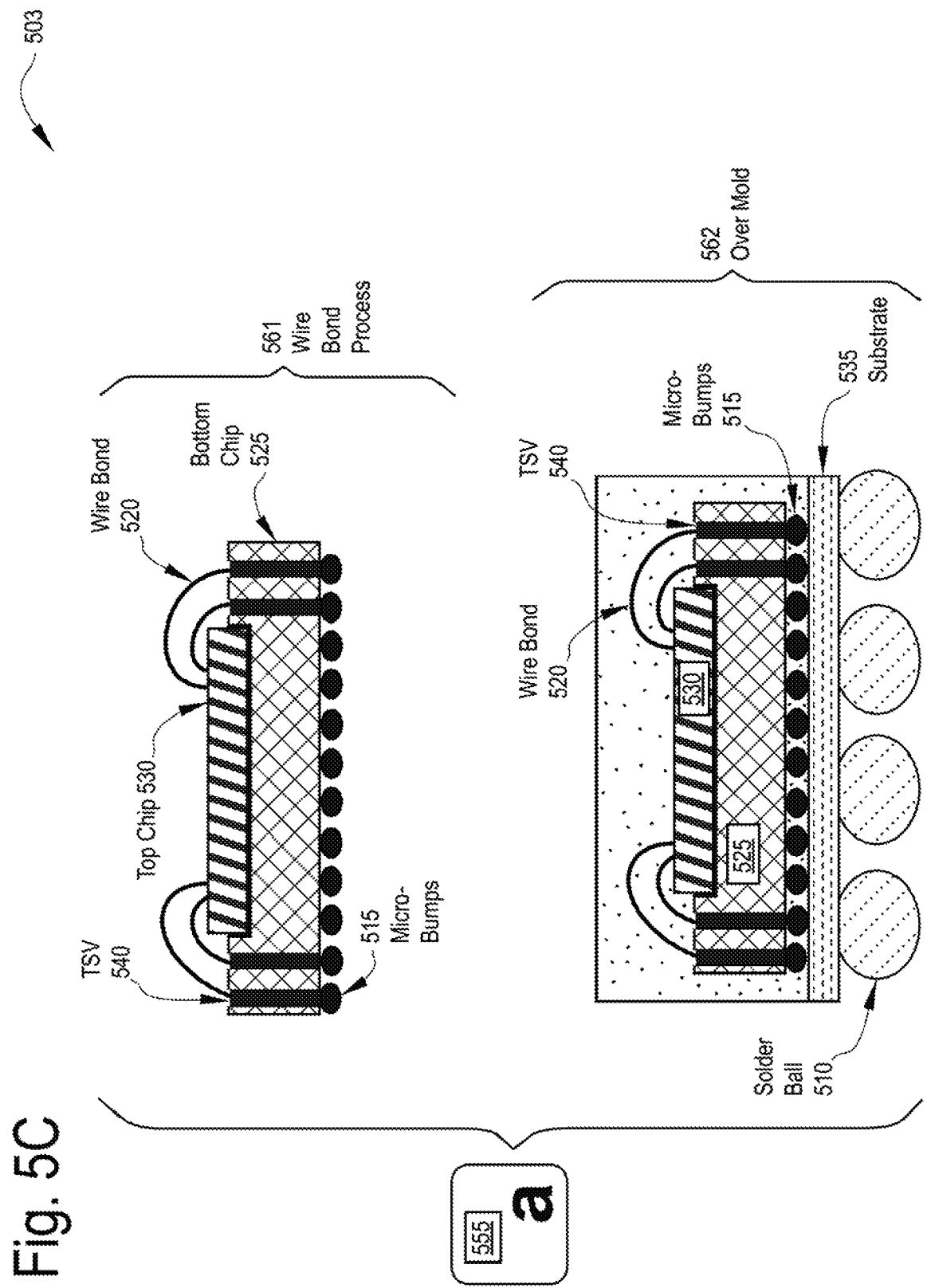
FIG. 5C depicts a continuation process flow for alternative processing (a) at element from FIG. 5B.

FIG. 5C depicts a continuation process flow 503 for alternative processing (a) at element 555 from FIG. 5B.

As depicted here at alternative processing (a) at element 555, a wire bond process 561 may be utilized to wire bond the top chip 530 having been pick and placed upon and into the recess formed within the bottom chip 525, thus creating a wire bond 520 from the contacts of the top chip 530 to the TSVs 540 formed within the bottom chip. Electrical connectivity is thus provided from contacts of the top chip 530 to the TSVs 540 via the wire bonds 520 and to the micro-bumps 515 which would then connect with or which would already be connected with a semiconductor package substrate (not shown here).

At over mold operation 562 the semiconductor package is then overmolded, thus fully encompassing and protecting the top chip 530 which is now within the recess of the bottom chip 525 and its electrical wire bond 520 connections to the TSVs 540 which lead then to the micro-bumps 515 to the substrate 535 to the solder balls 510.

Figure 5D:
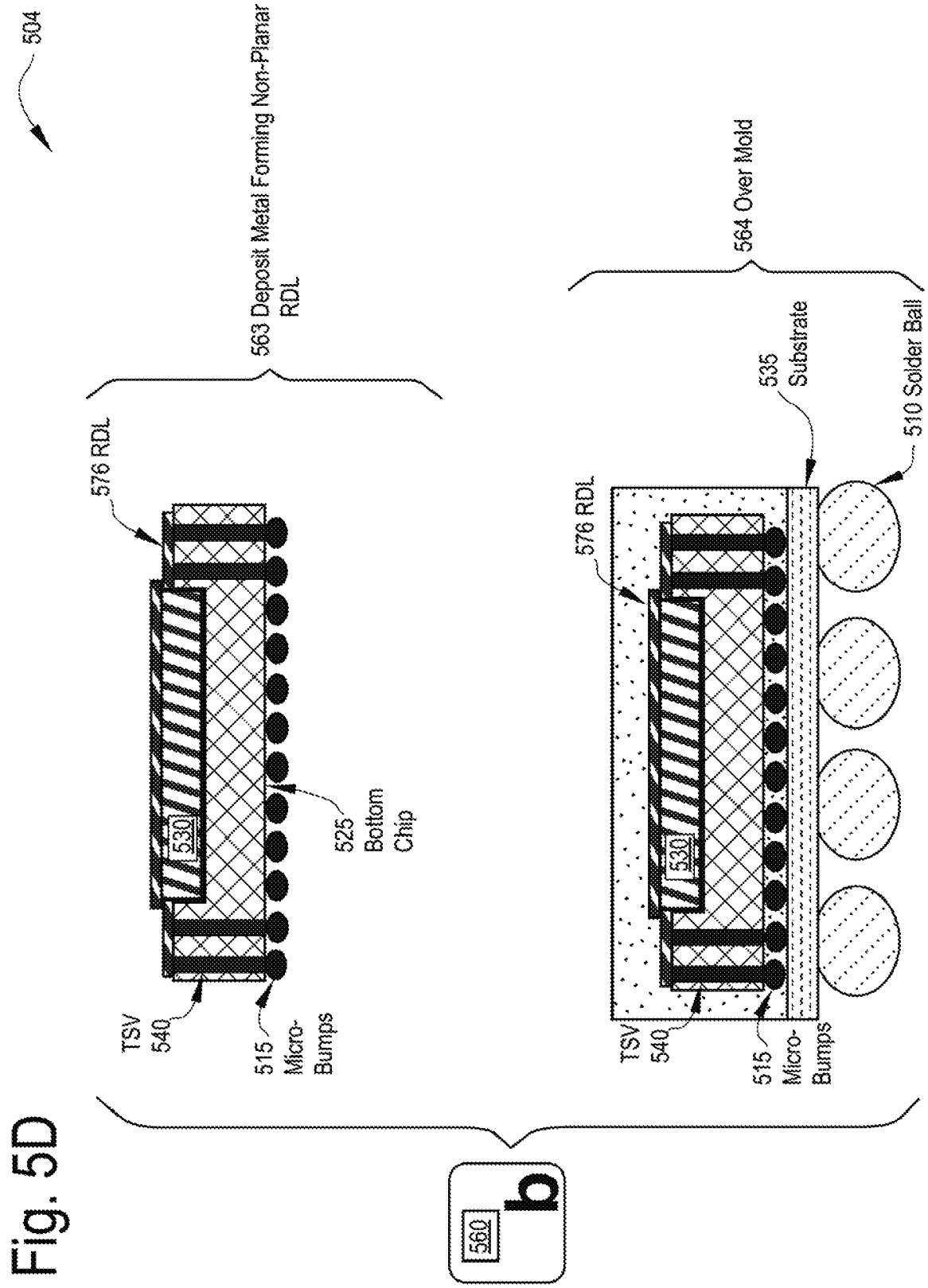
FIG. 5D depicts a continuation process flow for alternative processing (b) at element from FIG. 5B.

FIG. 5D depicts a continuation process flow 504 for alternative processing (b) at element 560 from FIG. 5B.

As depicted here at alternative processing (b) at element 560, operation 563 deposits the metal forming the non-planar RDL 576 on top of the already placed top chip 530 now residing within the recess of the bottom chip 525, thus providing connectivity from the contacts of the top chip 530 through the non-planar RDL 576 to the TSVs 540 through the bottom chip 525 and to the micro-bumps 515. According to such embodiments, any side gap between top and bottom dies due to varying tolerances may be filled prior to RDL layer buildup.

Notably, the top chip resides only partially within the recess of the bottom chip and therefore protrudes at a top surface from the bottom chip necessitating that there be a non-planar RDL 576 layer to accommodate the now non-planar surface formed from the top chip placed within the bottom chip.

At over mold operation 564 the semiconductor package is then overmolded, thus fully encompassing and protecting the top chip 530 which is now within the recess of the bottom chip 525 and its electrical non-planar RDL 576 connectivity with the TSVs 540 which lead then to the micro-bumps 515 to the substrate 535 to the solder balls 510.

Figure 5E:
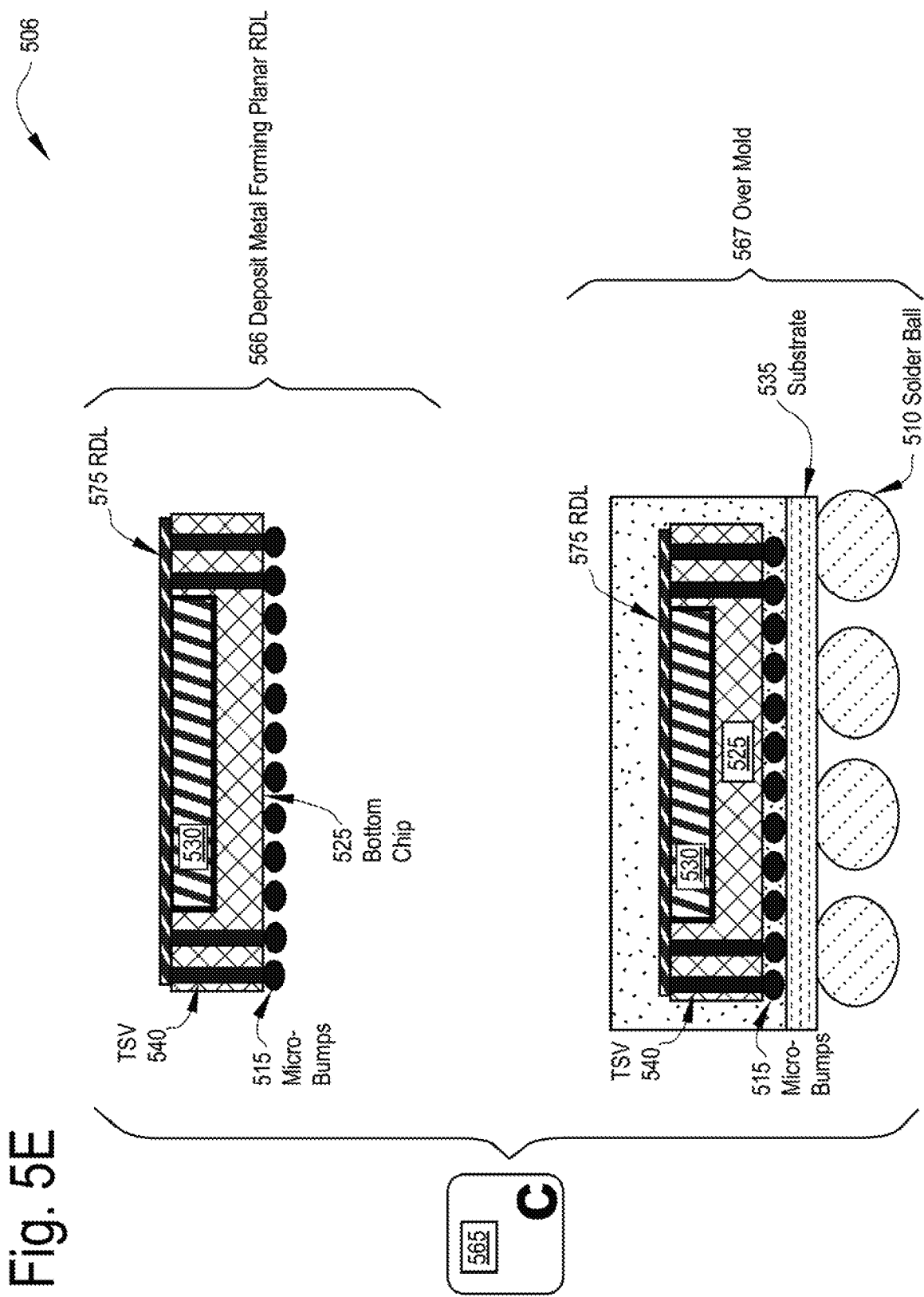
FIG. 5E depicts a continuation process flow for alternative processing (c) at element from FIG. 5B.

FIG. 5E depicts a continuation process flow 506 for alternative processing (c) at element 565 from FIG. 5B.

As depicted here at alternative processing (c) at element 565, operation 566 deposits the metal forming the planar RDL layer 575 on top of the already placed top chip 530 now residing fully within the recess of the bottom chip 525, thus providing connectivity from the contacts of the top chip 530 through the planar RDL 575 to the TSVs 540 through the bottom chip 525 and to the micro-bumps 515.

Notably, the entire height of the top chip is fully within the height of the bottom chip, permitting the bottom chip to fully encompass the top chip within its recess. Consequently, a planar RDL 575 may be formed rather than the non-planar RDL 576 depicted in the prior alternative processing (b) at element 560 of FIG. 5D.

At over mold operation 567 of FIG. 5E, the semiconductor package is then overmolded, thus fully encompassing and protecting the top chip 530 which is now within the recess of the bottom chip 525 and its electrical planar RDL 575 connectivity with the TSVs 540 which lead then to the micro-bumps 515 to the substrate 535 to the solder balls 510.

FIG. 6A depicts an alternative process flow 601 for the non-planar stacking of an overlapping top chip 630 onto a bottom chip 625.

As can be seen, there is first a top chip 630 which is placed up-side-down such that the bottom surface of the top chip 630 may be covered with a photo resist layer 645. Operation 661 then exposes the photo resist layer.

At operation 662 there is a wet etch process to etch away a recess into the bottom surface of the still up-side-down top chip 630.

At operation 663, the top chip 630 is now inverted by flipping the top chip 630 over such that the recess formed into the bottom surface of the top chip is now facing downward.

At operation 664 a pick and place operation places the top chip 630 onto a bottom chip forming a non-planar and overlapping stacked semiconductor package in which the top chip 630 full overlaps laterally in the horizontal axis the bottom chip 625, with the bottom chip 625 having its height at least partially encompassed within the height of the top chip 630 via the recess formed into the top chip 630.

In such a way, the overlapping top die or top chip 630 is thinned in the middle while the edge of the overlapping top chip 630 remain such that they (e.g., the edges) provide for greater die structural stabilization.

FIG. 6B depicts a continuation process flow 602 for a non-planar and overlapping top chip 630.

In particular, it can now be seen via the semiconductor package is underfilled 666 such that the assembled top chip 630 having the wet etched recess is overlapping the bottom chip 625 thus providing the reduced height 691 (in the Z or vertical axis) and additionally is protected by the underfill material 667. The x, y, and z axises 690 are depicted at the bottom left.

Additionally depicted is the top chip wire bonded 620 to the substrate 635 to provide electrical connectivity. Contacts of the bottom chip 625 are shown connected with the substrate 635 through the micro-bumps 615.

At the bottom of the figure the semiconductor package is now depicted as being connected to a PCB board 605 via solder balls 610 which electrically interface to the substrate 635.

FIG. 7 is a schematic of a computer system 700 in accordance with described embodiments. The computer system 700 (also referred to as the electronic system 700) as depicted can embody means for implementing reduced height semiconductor packages for mobile electronics, according to any of the several disclosed embodiments and their equivalents as set forth in this disclosure. The computer system 700 may be a mobile device such as a netbook computer. The computer system 700 may be a mobile device such as a wireless smart phone or tablet. The computer system 700 may be a desktop computer. The computer system 700 may be a hand-held reader. The computer system 700 may be a server system. The computer system 700 may be a supercomputer or high-performance computing system.

In accordance with one embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

Such an integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, electrical devices having gradient encapsulant protection, as disclosed herein.

In accordance with one embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In accordance with one embodiment, the integrated circuit 710 is complemented with a subsequent integrated circuit 711. Useful embodiments include a dual processor 713 and a dual communications circuit 715 and dual on-die memory 717 such as SRAM. In accordance with one embodiment, the dual integrated circuit 710 includes embedded on-die memory 716 such as eDRAM.

In one embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In accordance with one embodiment, the electronic system 700 also includes a display device 750 and an audio output 760. In one embodiment, the electronic system 700 includes an input device 770 such as a controller that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate or a semiconductor package having therein means for implementing reduced height semiconductor packages for mobile electronics, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing reduced height semiconductor packages for mobile electronics, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing reduced height semiconductor packages for mobile electronics embodiments and their equivalents. A foundation substrate 798 may be included, as represented by the dashed line of FIG. 7. Passive devices 799 may also be included, as is also depicted in FIG. 7.

Figure 8:
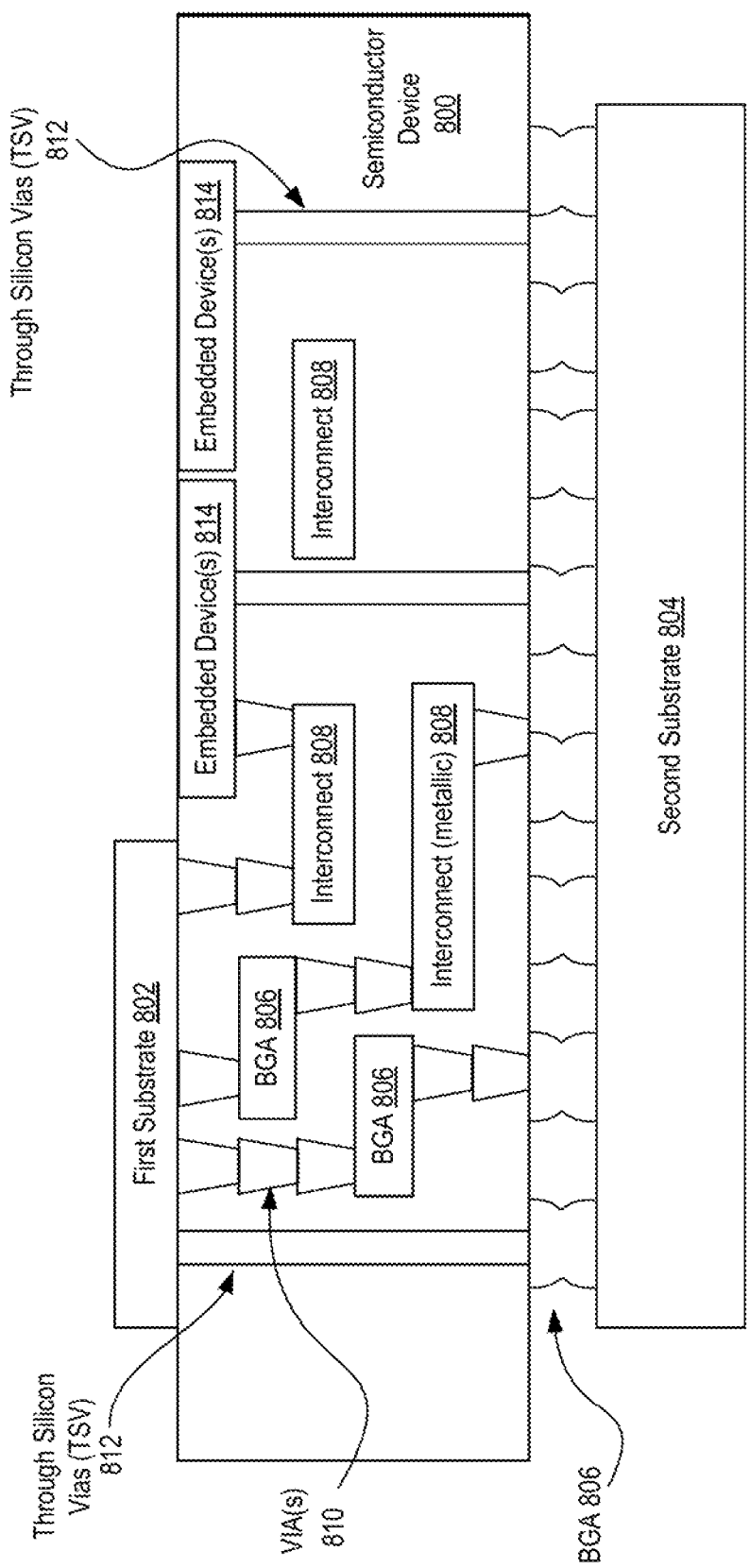
FIG. 8 illustrates an interposer that includes one or more described embodiments.

FIG. 8 illustrates an interposer 800 that includes one or more described embodiments. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with described embodiments, apparatuses or processes disclosed herein may be used in the fabrication of interposer 800.

Figure 9:
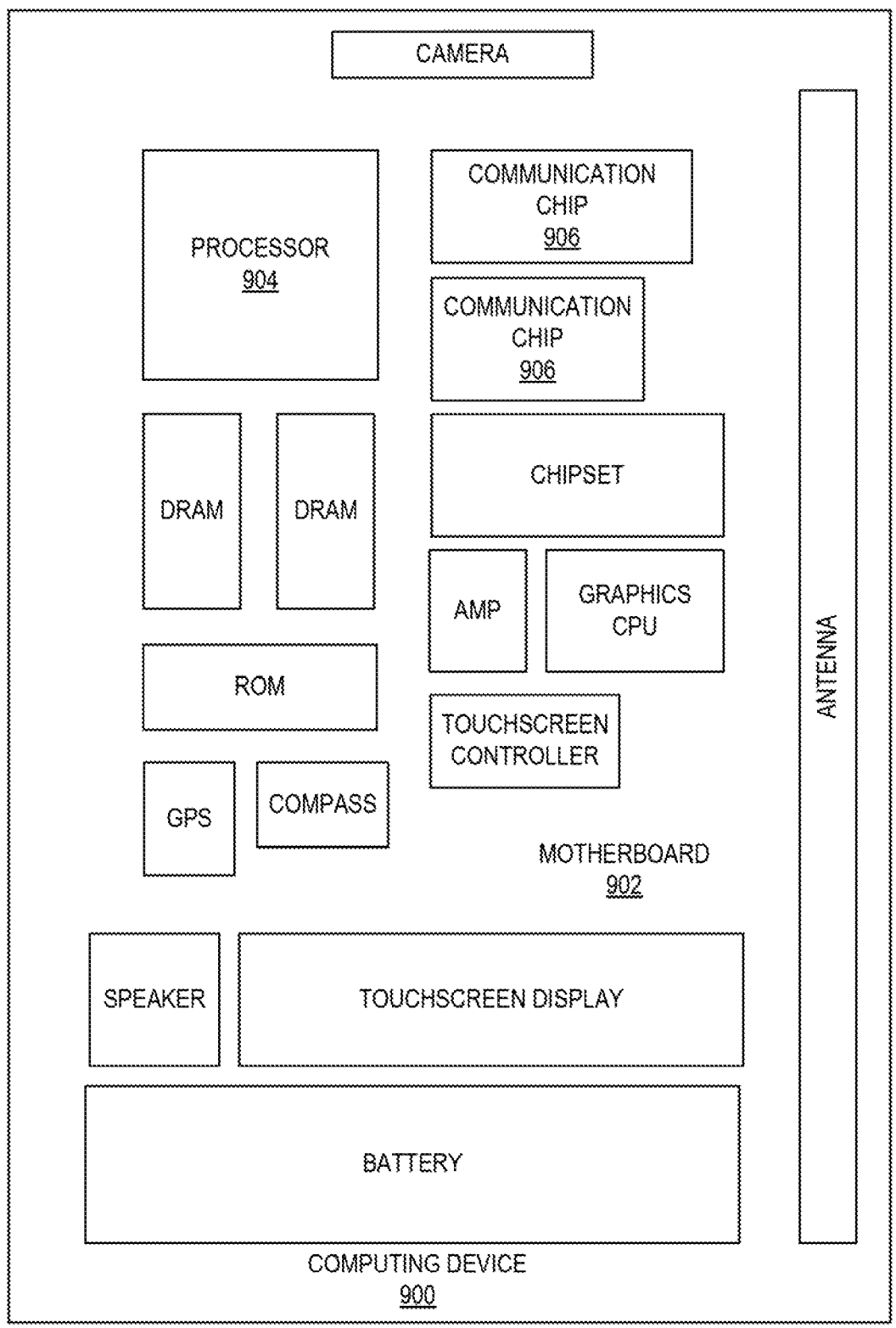
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as MOS-FET transistors built in accordance with implementations of the invention.

In further implementations, another component housed within the computing device 900 may contain an integrated circuit die that includes one or more devices, such as MOS-FET transistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
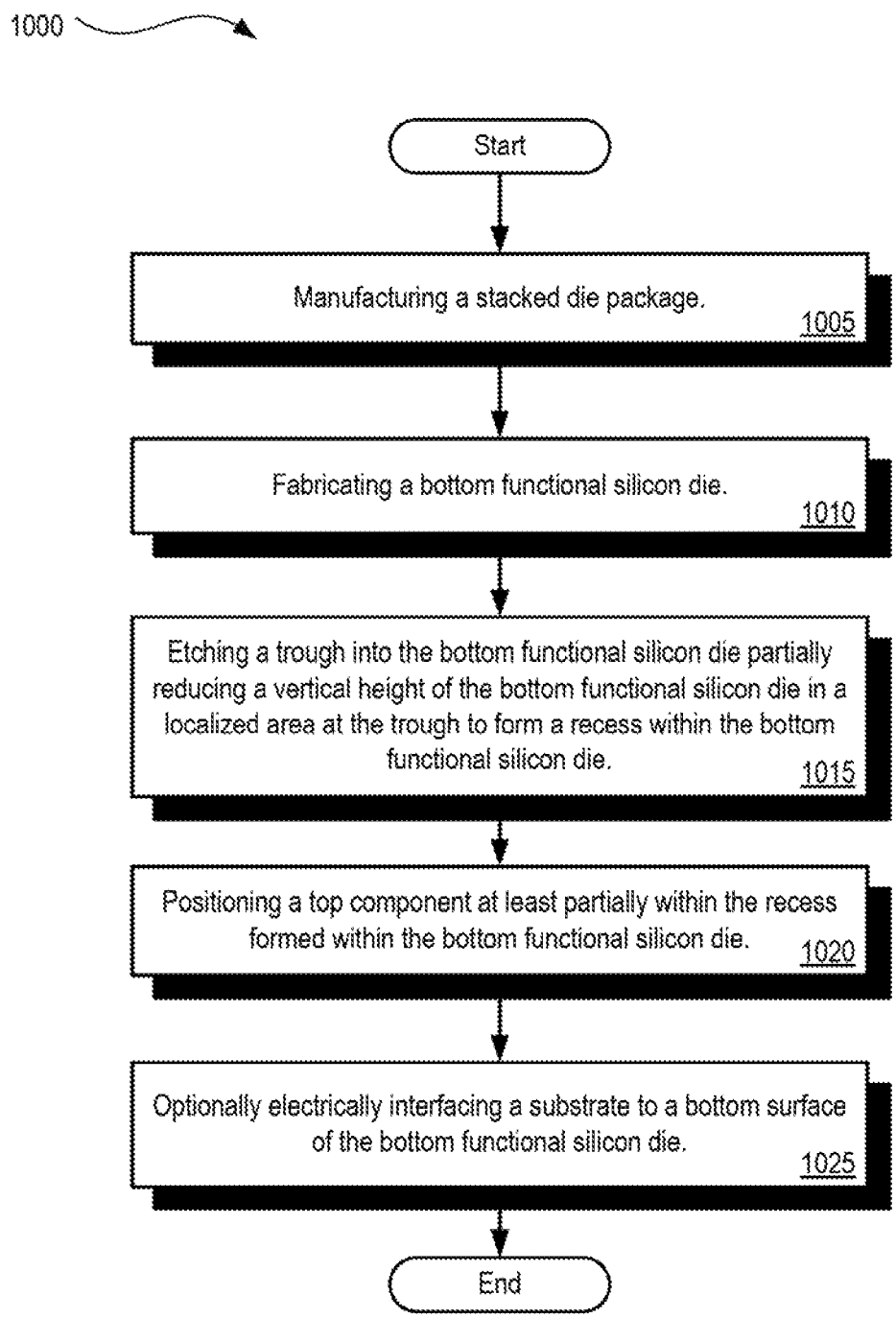
FIG. 10 is a flow diagram illustrating a method for implementing reduced height semiconductor packages for mobile electronics in accordance with described embodiments.

FIG. 10 is a flow diagram illustrating a method 1000 for implementing reduced height semiconductor packages for mobile electronics in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1000 may be utilized in a variety of combinations.

At block 1005 the method 1000 for manufacturing a stacked die package begins.

At block 1010 the method includes fabricating a bottom functional silicon die.

At block 1015 the method includes etching a trough into the bottom functional silicon die partially reducing a vertical height of the bottom functional silicon die in a localized area at the trough to form a recess within the bottom functional silicon die.

At block 1020 the method includes positioning a top component at least partially within the recess formed within the bottom functional silicon die.

At block 1025 the method may optionally include electrically interfacing a substrate to a bottom surface of the bottom functional silicon die. However, it is not necessary to incorporate the substrate into the stacked die package which may be electrically interfaced to another board (e.g., such as a PCB, motherboard, etc.) via alternative interfacing means.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a stacked die package having therein: a bottom functional silicon die; a recess formed within the bottom functional silicon die by a thinning etch partially reducing a vertical height of the bottom functional silicon die at the recess; a top component positioned at least partially within the recess formed within the bottom functional silicon die; and a substrate electrically interfaced with the bottom functional silicon die.

In accordance with another embodiment of the stacked die package, the top component positioned at least partially within the recess formed within the bottom functional silicon die includes a top functional silicon die positioned at least partially within the recess of the bottom functional silicon die.

In accordance with another embodiment of the stacked die package, the top component positioned at least partially within the recess formed within the bottom functional silicon die includes a heat spreader to extract heat away from a logic device integrated within the bottom functional silicon die.

In accordance with another embodiment of the stacked die package, the top component positioned at least partially within the recess formed within the bottom functional silicon die includes one of: a passive device; a memory chip, a second functional silicon die, a System on a Chip (SoC) device, a sensor unit, a receiver, a transmitter, or a transceiver.

In accordance with another embodiment of the stacked die package, the recess formed within the bottom functional silicon die is formed by a chemical wet etch process to open a trough within the bottom functional silicon die, in which the trough forms the recess within which the top component is positioned.

In accordance with another embodiment of the stacked die package, the recess formed within the bottom functional silicon die is formed by a Reactive Ion Etching (RIE) process to open the recess within the bottom functional silicon die within which the top component is positioned.

In accordance with another embodiment of the stacked die package, the bottom functional silicon die is electrically interfaced to the substrate via micro-balls of a Ball Grid Array or via a Flip-Chip Ball Grid Array (FCBGA) or via Copper pillar.

In accordance with another embodiment of the stacked die package, the top component includes a second functional silicon die positioned at least partially within the recess of the bottom functional silicon die; in which the bottom functional silicon die is electrically interfaced to the substrate via micro-balls of a Ball Grid Array (BGA) or via a Flip-Chip Ball Grid Array (FCBGA) or via Copper pillar; and in which the second functional silicon die is electrically interfaced to the substrate via wire bonds from contacts at a top surface of the second functional silicon die over one or more sides of the bottom functional silicon die to the substrate.

In accordance with another embodiment of the stacked die package, the top component includes a second functional silicon die positioned at least partially within the recess of the bottom functional silicon die; in which the bottom functional silicon die includes a plurality of Through Silicon Vias (TSVs), each of the TSVs providing an electrical pathway from a top surface of the bottom functional silicon die to a bottom surface of the bottom functional silicon die; in which the second functional silicon die is electrically interfaced to the substrate via wire bonds from contacts at a top surface of the second functional silicon die to the plurality of TSVs of the bottom functional silicon die, the TSVs of the bottom functional silicon die providing electrical connectivity from the top surface of the bottom functional silicon die to the bottom surface of the bottom functional silicon die; and in which the bottom surface of the functional silicon die is electrically interfaced to the substrate via micro-balls between the bottom surface of the functional silicon die and a top surface of the substrate.

In accordance with another embodiment of the stacked die package, the top component includes a second functional silicon die positioned at least partially within the recess of the bottom functional silicon die; in which the bottom functional silicon die includes a plurality of Through Silicon Vias (TSVs), each of the TSVs providing an electrical pathway from a top surface of the bottom functional silicon die to a bottom surface of the bottom functional silicon die; in which the second functional silicon die is electrically interfaced to the substrate using a Re-Distribution Layer (RDL) providing electrical connectivity from contacts at a top surface of the second functional silicon die to the plurality of TSVs of the bottom functional silicon die, the TSVs of the bottom functional silicon die providing electrical connectivity from the top surface of the bottom functional silicon die to the bottom surface of the bottom functional silicon die; and in which the bottom surface of the functional silicon die is electrically interfaced to the substrate via micro-balls between the bottom surface of the functional silicon die and a top surface of the substrate.

In accordance with another embodiment, the stacked die package further includes: a plurality of micro-balls providing electrical connectivity between a bottom surface of the bottom functional semiconductor device and a top surface of the substrate of the stacked die package; and solder balls at a bottom surface of the substrate to provide electrical connectivity from the substrate of the stacked die package to another circuit board, printed circuit board, assembly board, mother board, or sub-assembly board of a consumer electronics device.

In accordance with another embodiment of the stacked die package, the top component has a height which is fully encompassed within a height of the recess formed within the bottom functional silicon device; and in which a top surface of the top component is planar with a top non-recessed surface of the bottom functional silicon device.

In accordance with another embodiment of the stacked die package, the top component has a height which is greater than a height of the recess formed within the bottom functional silicon device; and in which a top surface of the top component protrudes beyond a top non-recessed surface of the bottom functional silicon device.

It is therefore in accordance with yet another embodiment that there is a method of manufacturing a stacked die package, in which the method includes at least: fabricating a bottom functional silicon die; etching a trough into the bottom functional silicon die partially reducing a vertical height of the bottom functional silicon die in a localized area at the trough to form a recess within the bottom functional silicon die; positioning a top component at least partially within the recess formed within the bottom functional silicon die; and electrically interfacing a substrate to a bottom surface of the bottom functional silicon die.

In accordance with another embodiment of the method, positioning the top component at least partially within the recess formed within the bottom functional silicon die includes: positioning the top component via a pick and place operation; and affixing the top component positioned within the recess of the bottom functional silicon die via a glue or a die attached film.

In accordance with another embodiment of the method, electrically interfacing the substrate to the bottom surface of the bottom functional silicon die includes: affixing the substrate to the bottom surface of the bottom functional silicon die via micro-balls of a Ball Grid Array using a reflow operation.

In accordance with another embodiment of the method, etching the trough into the bottom functional silicon die includes performing a chemical wet etch to open the trough within the bottom functional silicon die, in which the trough forms the recess within which the top component is positioned.

In accordance with another embodiment of the method, etching the trough into the bottom functional silicon die includes performing a Reactive Ion Etching (RIE) process to open the recess within the bottom functional silicon die within which the top component is positioned.

In accordance with another embodiment of the method, the top component includes a second functional silicon die positioned at least partially within the recess of the bottom functional silicon die; and in which the method further includes wire bonding contacts at a top surface of the second functional silicon die to a top surface of the substrate over one or more sides of the bottom functional silicon device.

In accordance with another embodiment of the method, the top component includes a second functional silicon die positioned at least partially within the recess of the bottom functional silicon die; and in which the method further includes: opening a plurality of Through Silicon Vias (TSVs) vertically through the bottom functional silicon die, each of the TSVs providing an electrical pathway from a top surface of the bottom functional silicon die to a bottom surface of the bottom functional silicon die; and electrically interfacing contacts at a top surface of the second functional silicon die to the plurality of TSVs of the bottom functional silicon die, the TSVs of the bottom functional silicon die providing electrical connectivity from the top surface of the bottom functional silicon die to the bottom surface of the bottom functional silicon die; and in which the bottom surface of the functional silicon die is electrically interfaced to the substrate via micro-balls between the bottom surface of the functional silicon die and a top surface of the substrate.

In accordance with another embodiment of the method, top component includes a second functional silicon die positioned at least partially within the recess of the bottom functional silicon die; and in which the method further includes: opening a plurality of Through Silicon Vias (TSVs) vertically through the bottom functional silicon die, each of the TSVs providing an electrical pathway from a top surface of the bottom functional silicon die to a bottom surface of the bottom functional silicon die; and depositing metal at a top surface of the second functional silicon die forming a Re-Distribution Layer (RDL) providing electrical connectivity from contacts at a top surface of the second functional silicon die to the plurality of TSVs of the bottom functional silicon die, the TSVs of the bottom functional silicon die providing electrical connectivity from the top surface of the bottom functional silicon die to the bottom surface of the bottom functional silicon die; and in which the bottom surface of the functional silicon die is electrically interfaced to the substrate via micro-balls between the bottom surface of the functional silicon die and a top surface of the substrate.

It is therefore in accordance with yet another embodiment that there is an electronics module, the electronics module including: a printed circuit board; a stacked die package; a plurality of solder balls electrically interfacing the stacked die package with the printed circuit board; and in which the stacked die package includes: (i) a bottom functional silicon die; (ii) a recess formed within the bottom functional silicon die by a thinning etch partially reducing a vertical height of the bottom functional silicon die at the recess; (iii) a top component positioned at least partially within the recess formed within the bottom functional silicon die; and (iv) a substrate electrically interfaced with the bottom functional silicon die.

In accordance with another embodiment of the electronics module, the bottom functional silicon die of the stacked die package is electrically interfaced to the substrate of the stacked die package via micro-balls of a Ball Grid Array or via a Flip-Chip Ball Grid Array (FCBGA) or via Copper pillar.

In accordance with another embodiment of the electronics module, the electronics module includes one of: a drone and robot control electronics module; a smart phone electronics module; a tablet electronics module; a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

In accordance with another embodiment of the electronics module, the electronics module includes is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. A stacked die package, comprising:
a bottom functional silicon die, wherein the bottom functional silicon die comprises a plurality of Through Silicon Vias (TSVs);
a recess within the bottom functional silicon die, the recess having a perimeter, wherein the plurality of TSVs is outside of the perimeter of the recess, and wherein there are no TSVs in the bottom functional silicon die inside of the perimeter of the recess; and
a top component positioned at least partially within the recess within the bottom functional silicon die, wherein the top component is directly electrically connected to one or more of the plurality of TSVs outside of the perimeter of the recess.

2. The stacked die package of claim 1, wherein the top component positioned at least partially within the recess within the bottom functional silicon die comprises a top functional silicon die positioned at least partially within the recess of the bottom functional silicon die.

3. The stacked die package of claim 1, wherein the top component positioned at least partially within the recess within the bottom functional silicon die comprises a heat spreader to extract heat away from a logic device integrated within the bottom functional silicon die.

4. The stacked die package of claim 1, wherein the top component positioned at least partially within the recess within the bottom functional silicon die comprises one of:
a passive device;
a memory chip, an upper functional silicon die,
a System on a Chip (SoC) device, a sensor unit, a receiver, a transmitter, or a transceiver.

5. The stacked die package of claim 1, wherein the recess within the bottom functional silicon die is formed by a chemical wet etch process to open a trough within the bottom functional silicon die, wherein the trough forms the recess within which the top component is positioned.

6. The stacked die package of claim 1, wherein the recess within the bottom functional silicon die is formed by a Reactive Ion Etching (ME) process to open the recess within the bottom functional silicon die within which the top component is positioned.

7. The stacked die package of claim 1:
wherein the stacked die package further comprises a substrate electrically interfaced with the bottom functional silicon die; and
wherein the bottom functional silicon die is electrically interfaced to the substrate via micro-balls of a Ball Grid Array or via a Flip-Chip Ball Grid Array (FCBGA) or via Copper pillar.

8. The stacked die package of claim 1:
wherein the stacked die package further comprises a substrate electrically interfaced with the bottom functional silicon die;
wherein the top component comprises an upper functional silicon die positioned at least partially within the recess of the bottom functional silicon die;
wherein the bottom functional silicon die is electrically interfaced to the substrate via micro-balls of a Ball Grid Array (BGA) or via a Flip-Chip Ball Grid Array (FCBGA) or via Copper pillar; and
wherein the upper functional silicon die is electrically interfaced to the substrate via wire bonds from contacts at a top surface of the upper functional silicon die over one or more sides of the bottom functional silicon die to the substrate.

9. The stacked die package of claim 1:
wherein the stacked die package further comprises a substrate electrically interfaced with the bottom functional silicon die;
wherein the top component comprises an upper functional silicon die positioned at least partially within the recess of the bottom functional silicon die;
wherein each of the TSVs providing an electrical pathway from a top surface of the bottom functional silicon die to a bottom surface of the bottom functional silicon die;
wherein the upper functional silicon die is electrically interfaced to the substrate via wire bonds from contacts at a top surface of the upper functional silicon die to the plurality of TSVs of the bottom functional silicon die, the TSVs of the bottom functional silicon die providing electrical connectivity from the top surface of the bottom functional silicon die to the bottom surface of the bottom functional silicon die; and
wherein the bottom surface of the functional silicon die is electrically interfaced to the substrate via micro-balls between the bottom surface of the functional silicon die and a top surface of the substrate.

10. The stacked die package of claim 1:
wherein the stacked die package further comprises a substrate electrically interfaced with the bottom functional silicon die;
wherein the top component comprises an upper functional silicon die positioned at least partially within the recess of the bottom functional silicon die;
wherein each of the TSVs provide an electrical pathway from a top surface of the bottom functional silicon die to a bottom surface of the bottom functional silicon die;
wherein the upper functional silicon die is electrically interfaced to the substrate using a Re-Distribution Layer (RDL) providing electrical connectivity from contacts at a top surface of the upper functional silicon die to the plurality of TSVs of the bottom functional silicon die, the TSVs of the bottom functional silicon die providing electrical connectivity from the top surface of the bottom functional silicon die to the bottom surface of the bottom functional silicon die; and
wherein the bottom surface of the functional silicon die is electrically interfaced to the substrate via micro-balls between the bottom surface of the functional silicon die and a top surface of the substrate.

11. The stacked die package of claim 1, further comprising:
a substrate electrically interfaced with the bottom functional silicon die;
a plurality of micro-balls providing electrical connectivity between a bottom surface of the bottom functional semiconductor die and a top surface of the substrate of the stacked die package; and
solder balls at a bottom surface of the substrate to provide electrical connectivity from the substrate of the stacked die package to another circuit board, printed circuit board, assembly board, mother board, or sub-assembly board of a consumer electronics device.

12. The stacked die package of claim 1:
wherein the top component has a height which is fully encompassed within a height of the recess within the bottom functional silicon die; and
wherein a top surface of the top component is planar with a top non-recessed surface of the bottom functional silicon die.

13. The stacked die package of claim 1:
wherein the top component has a height which is greater than a height of the recess within the bottom functional silicon die; and
wherein a top surface of the top component protrudes beyond a top non-recessed surface of the bottom functional silicon die.

14. A method of manufacturing a stacked die package, comprising:
fabricating a bottom functional silicon die including opening a plurality of Through Silicon Vias (TSVs) vertically through the bottom functional silicon die;
etching a trough into the bottom functional silicon die partially reducing a vertical height of the bottom functional silicon die in a localized area at the trough to form a recess within the bottom functional silicon die, the recess having a perimeter, wherein the plurality of TSVs is outside of the perimeter of the recess, and wherein there are no TSVs in the bottom functional silicon die inside of the perimeter of the recess;
positioning a top component at least partially within the recess within the bottom functional silicon die; and
directly electrically connecting the top component to one or more of the plurality of TSVs outside of the perimeter of the recess.

15. The method of claim 14, wherein positioning the top component at least partially within the recess within the bottom functional silicon die comprises:
positioning the top component via a pick and place operation; and
affixing the top component positioned within the recess of the bottom functional silicon die via a glue or a die attached film.

16. The method of claim 14, wherein the stacked die package further comprises a substrate electrically interfaced with a bottom surface of the bottom function silicon die; wherein electrically interfacing the substrate to the bottom surface of the bottom functional silicon die comprises; affixing the substrate to the bottom surface of the bottom functional silicon die via micro-balls of a Ball Grid Array using a reflow operation.

17. The method of claim 14, wherein etching the trough into the bottom functional silicon die comprises performing a chemical wet etch to open the trough within the bottom functional silicon die, wherein the trough forms the recess within which the top component is positioned.

18. The method of claim 14, wherein etching the trough into the bottom functional silicon die comprises performing a Reactive Ion Etching (RIE) process to open the recess within the bottom functional silicon die within which the top component is positioned.

19. The method of claim 14:
wherein the stacked die package further comprises a substrate electrically interfaced with the bottom functional silicon die;
wherein the top component comprises an upper functional silicon die positioned at least partially within the recess of the bottom functional silicon die; and
wherein the method further comprises wire bonding contacts at a top surface of the upper functional silicon die to a top surface of the substrate over one or more sides of the bottom functional silicon die.

20. The method of claim 14:
wherein the stacked die package further comprises a substrate electrically interfaced with the bottom functional silicon die;
wherein the top component comprises an upper functional silicon die positioned at least partially within the recess of the bottom functional silicon die; and
wherein the method further comprises:
each of the TSVs providing an electrical pathway from a top surface of the bottom functional silicon die to a bottom surface of the bottom functional silicon die; and
electrically interfacing contacts at a top surface of the upper functional silicon die to the plurality of TSVs of the bottom functional silicon die, the TSVs of the bottom functional silicon die providing electrical connectivity from the top surface of the bottom functional silicon die to the bottom surface of the bottom functional silicon die; and
wherein the bottom surface of the functional silicon die is electrically interfaced to the substrate via micro-balls between the bottom surface of the functional silicon die and a top surface of the substrate.

21. The method of claim 14:
wherein the stacked die package further comprises a substrate electrically interfaced with the bottom functional silicon die;
wherein the top component comprises an upper functional silicon die positioned at least partially within the recess of the bottom functional silicon die; and
wherein the method further comprises:
opening the plurality of Through Silicon Vias (TSVs) vertically through the bottom functional silicon die, each of the TSVs providing an electrical pathway from a top surface of the bottom functional silicon die to a bottom surface of the bottom functional silicon die; and
depositing metal at a top surface of the upper functional silicon die forming a Re-Distribution Layer (RDL) providing electrical connectivity from contacts at the top surface of the upper functional silicon die to the plurality of TSVs of the bottom functional silicon die, the TSVs of the bottom functional silicon die providing electrical connectivity from the top surface of the bottom functional silicon die to the bottom surface of the bottom functional silicon die; and
wherein the bottom surface of the bottom functional silicon die is electrically interfaced to the substrate via micro-balls between the bottom surface of the bottom functional silicon die and a top surface of the substrate.

22. An electronics module comprising:
a printed circuit board;
a stacked die package;
a plurality of solder balls electrically interfacing the stacked die package with the printed circuit board; and
wherein the stacked die package comprises:
(i) a bottom functional silicon die, wherein the bottom functional silicon die comprises a plurality of Through Silicon Vias (TSVs);
(ii) a recess within the bottom functional silicon die, the recess having a perimeter, wherein the plurality of TSVs is outside of the perimeter of the recess and wherein there are no TSVs in the bottom functional silicon die inside of the perimeter of the recess; and (iii) a top component positioned at least partially within the recess within the bottom functional silicon die, wherein the top component is directly electrically connected to one or more of the plurality of TSVs outside of the perimeter of the recess.

23. The electronics module of claim 22:
wherein the stacked die package further comprises a substrate electrically interfaced with the bottom functional silicon die; and
wherein the bottom functional silicon die of the stacked die package is electrically interfaced to the substrate of the stacked die package via micro-balls of a Ball Grid Array or via a Flip-Chip Ball Grid Array (FCBGA) or via Copper pillar.

24. The electronics module of claim 22, wherein the electronics module comprises one of:
a drone and robot control electronics module;
a smart phone electronics module;
a tablet electronics module;
a gesture control electronics module for a computer;
a 3D photography electronics module;
a 3D immersive gaming electronics module;
a face recognition electronics module to perform face recognition base security in-lieu of alphanumerical passwords;
an image capture device electronics module having one or more optical and Complementary metal-oxide-semiconductor (CMOS) components affixed to the printed circuit board as the top side or bottom side components;
a depth sensing camera electronics module to perform any of stereoscopic imaging depth sensing, coded light depth sensing, or laser time of flight depth sensing.

25. The electronics module of claim 22, wherein the electronics module is embedded within a wearable technology to be worn as one of:
a clothing item;
sports attire;
a shoe;
fashion electronics to be worn as a clothing item or an accessory;
tech togs to be worn as a clothing item or an accessory; or
fashionable technology to be worn as a clothing item or an accessory.

\* \* \* \* \*